United States Patent
Cheng et al.

(10) Patent No.: US 10,157,839 B1
(45) Date of Patent: Dec. 18, 2018

(54) INTERCONNECT STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chia-Jen Cheng, Taipei County (TW); Hsiu-Mei Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/842,498

(22) Filed: Dec. 14, 2017

Related U.S. Application Data

(60) Provisional application No. 62/511,762, filed on May 26, 2017.

(51) Int. Cl.
  *H01L 23/52* (2006.01)
  *H01L 23/528* (2006.01)
  *H01L 21/768* (2006.01)
  *H01L 23/532* (2006.01)

(52) U.S. Cl.
  CPC .......... *H01L 23/528* (2013.01); *H01L 21/768* (2013.01); *H01L 23/532* (2013.01)

(58) Field of Classification Search
  CPC .... H01L 23/528; H01L 21/768; H01L 23/532
  USPC ......................................................... 257/734
  See application file for complete search history.

(56) References Cited

U.S. PATENT DOCUMENTS

| | | | |
|---|---|---|---|
| 7,763,969 B2* | 7/2010 | Zeng | H01L 23/5389 257/700 |
| 9,258,897 B2* | 2/2016 | Ishihara | H05K 1/183 |
| 2006/0145328 A1* | 7/2006 | Hsu | H01L 23/5389 257/690 |
| 2008/0099910 A1* | 5/2008 | McLellan | H01L 21/563 257/723 |

* cited by examiner

*Primary Examiner* — Luan C Thai
(74) *Attorney, Agent, or Firm* — WPAT, P.C. Intellectual Property Attorneys; Anthony King

(57) ABSTRACT

An interconnect structure includes a first substrate including a first surface, a second surface opposite to the first surface, a cavity extended through the first substrate, and a first recess extended from the second surface towards the first surface; a second substrate disposed opposite to the second surface of the first substrate; an electronic device disposed within the cavity; a first polymeric layer disposed over the first surface and within the cavity of the first substrate; and a second polymeric layer disposed between the first substrate and the second substrate and within the first recess.

20 Claims, 32 Drawing Sheets

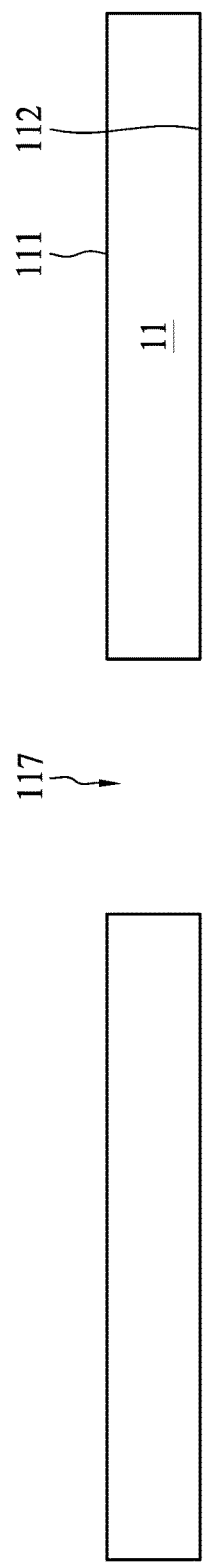

INTERCONNECT STRUCTURE AND MANUFACTURING METHOD THEREOF

PRIORITY CLAIM AND CROSS-REFERENCE

This application claims the benefit of U.S. provisional application Ser. No. 62/511,762 filed on May 26, 2017 and entitled "Semiconductor Structure and Manufacturing Method Thereof", the disclosure of which is hereby incorporated by reference in its entirety.

BACKGROUND

Electronic equipments using interconnect structures are essential for many modern applications. With the advancement of electronic technology, the interconnect structures are becoming increasingly smaller in size while having greater functionality and greater amounts of integrated circuitry. Due to the miniaturized scale of the interconnect structure, numerous manufacturing operations are implemented within such a small interconnect structure.

However, the manufacturing operations of the interconnect structure involve many steps and operations on such a small and thin interconnect structure. The manufacturing of the interconnect structure in a miniaturized scale becomes more complicated. An increase in a complexity of manufacturing the interconnect structure may cause deficiencies such as poor electrical interconnection, delamination of components, or other issues, resulting in a high yield loss of the interconnect structure and increase of manufacturing cost. As such, there are many challenges for modifying a structure of the interconnect structures and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
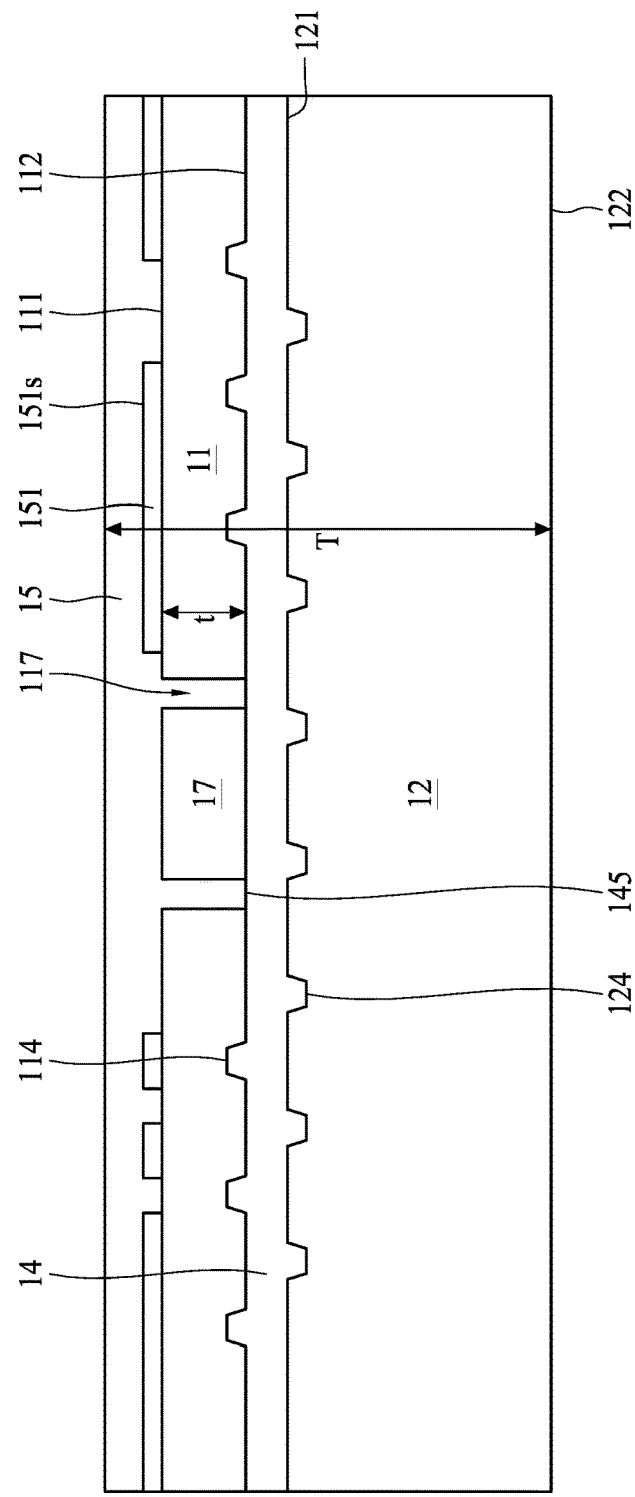
FIG. 1 is a cross-sectional view of an interconnect structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the advancement of electronic technology, interconnect structures are becoming increasingly smaller in size while having greater functionality and greater amounts of integrated circuitry. A substrate embedded with devices can deliver higher performance, lower power consumption and lower system costs, due to smaller package size, reduced PCB layer count, eliminated interface supporting components or improved system reliability.

However, the interconnect structure in small package size may lead to warpage issue. For example, a thickness of the substrate smaller than 200 µm may have serious warpage.

The warpage problem may further result in poor electrical connection or failure of the interconnect structure.

The warpage issue can be mitigated by increasing the thickness of the substrate. However, the substrate embedded with devices usually suffers from void issue if the thickness of the substrate is increased. Void may be developed during the embedding process if the thickness of the substrate is greater than 200 μm.

In the present disclosure, an interconnect structure is disclosed. The interconnect structure includes a first substrate with a first surface and a second surface, a cavity extended through the substrate, a second substrate disposed at the second surface, a recess extended from the second surface towards the first surface, an electronic device disposed within the cavity, a first polymeric layer disposed over the first surface and within the cavity, and a second polymeric layer disposed at the second surface and within the recess. The first substrate and the second substrate are stacked over and bonded with each other, and thus a total thickness of the substrates (e.g. greater than 200 um) can reduce or prevent warpage of the interconnect structure. Furthermore, the first polymeric layer is only required to fill the cavity in small height (e.g. less than 200 um), flowing of the first polymeric layer is improved and therefore voiding can be reduced or prevented.

FIG. 1 is a cross-sectional view of an interconnect structure 1 in accordance with some embodiments of the present disclosure. The interconnect structure 1 includes a first substrate 11, a second substrate 12, an electronic device 17, a first polymeric layer 15, and a second polymeric layer 14. In some embodiments, the interconnect structure 1 is a semiconductor package. In some embodiments, the interconnect structure 1 is a multiple dimensional package such as 3 dimensional package. In some embodiments, the interconnect structure 1 is a part of a flip chip ball grid array (FCBGA) package.

In some embodiments, the first substrate 11 is a core substrate. In some embodiments, the first substrate 11 includes organic material. In some embodiments, the first substrate 11 includes epoxy, resin or glass fiber. In some embodiments, a thickness t of the first substrate 11 is substantially smaller than or equal to 200 um. In some embodiments, the thickness t of the first substrate 11 is about 100 um to about 200 um.

In some embodiments, the first substrate 11 includes a first surface 111 and a second surface 112 opposite to the first surface 111. In some embodiments, the first substrate 11 includes a cavity 117. In some embodiments, the cavity 117 extends between the first surface 111 and the second surface 112. In some embodiments, the cavity 117 extends through the first substrate 11. In some embodiments, a thickness of the cavity 117 is same as a thickness of the first substrate 11.

In some embodiments, the first substrate 11 includes several first recesses 114 at the second surface 112. In some embodiments, the first recesses 114 are recessed from the second surface 112 and extended from the second surface 112 towards the first surface 111. In some embodiments, the first recesses 114 do not penetrate through the first substrate 11. In some embodiments, the first recesses 114 are configured to increase surface area of the first substrate 11.

Figure 1A:
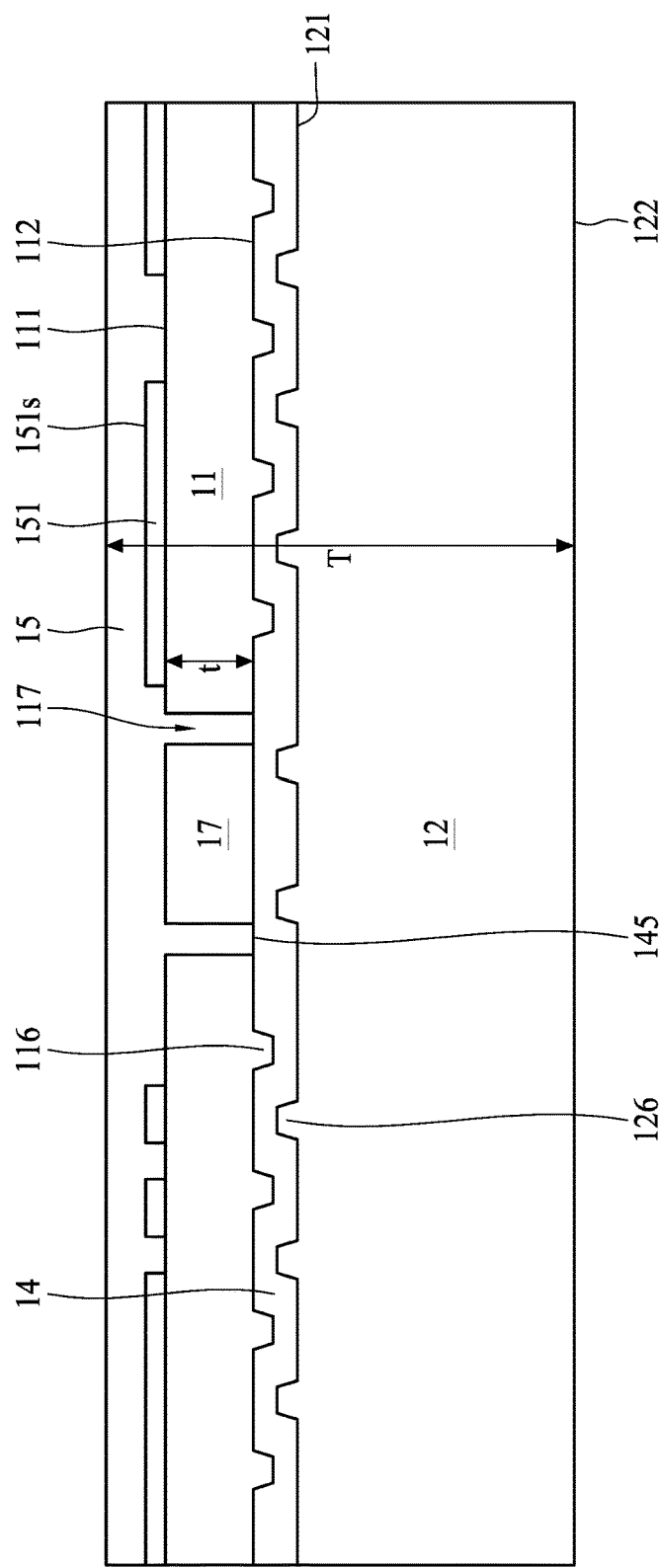
FIG. 1A is a cross-sectional view of an interconnect structure in accordance with some embodiments of the present disclosure.

In some embodiments as shown in FIG. 1A, the first substrate 11 includes several first protrusions 116 at the second surface 112. In some embodiments, the first protrusions 116 are protruded from the second surface 112 and extended from the second surface 112 and away from the first surface 111. In some embodiments, the first protrusions 116 are configured to increase surface area of the first substrate 11.

Referring back to FIG. 1, in some embodiments, the second substrate 12 is disposed below the first substrate 11. In some embodiments, the second substrate 12 is disposed opposite to the second surface 112 of the first substrate 11. In some embodiments, the second susbtrate 12 is a core substrate. In some embodiments, the second susbtrate 12 includes organic material. In some embodiments, the second susbtrate 12 includes epoxy, resin or glass fiber. In some embodiments, the first substrate 11 and the second substrate 12 include same material. In some embodiments, a thickness of the second substrate 12 is substantially greater than or equal to 200 um. In some embodiments the thickness of the second substrate 12 is about 300 um to about 600 um.

In some embodiments, the second substrate 12 includes a third surface 121 and a fourth surface 122 opposite to the third surface 121. In some embodiments, the third surface 121 faces to the second surface 112 of the first substrate 11. In some embodiments, the second substrate 12 includes several second recesses 124. In some embodiments, the second recesses 124 are recessed from the third surface 121 and extended from the third surface 121 towards the fourth surface 122. In some embodiments, the second recesses 124 do not penetrate through the second substrate 12. In some embodiments, the second recesses 124 are configured to increase surface area of the second substrate 12.

In some embodiments as shown in FIG. 1A, the second substrate 12 includes several second protrusions 126 at the third surface 121. In some embodiments, the second protrusions 126 are protruded from the third surface 121 and extended from the third surface 121 and away from the fourth surface 122. In some embodiments, the second protrusions 126 are configured to increase surface area of the second substrate 12.

Referring back to FIG. 1, in some embodiments, the electronic device 17 is disposed within the cavity 117 of the first substrate 11. In some embodiments, the electronic device 17 is a small piece including semiconductive materials such as silicon, and is fabricated with a predetermined functional circuit within the electronic device 17 produced by photolithography or any suitable operations. In some embodiments, the electronic device 17 is singulated from a silicon wafer by a mechanical or laser blade. In some embodiments, the electronic device 17 is a chip, a passive device, an active device, a line conductor, a microstrip structure or the like. In some embodiments, the electronic device 17 comprises a variety of electrical circuits suitable for a particular application. In some embodiments, the electrical circuits include various devices such as transistors, capacitors, resistors, diodes and/or the like. In some embodiments, the electronic device 17 includes capacitor, resistor, inductor or the like. In some embodiments, the electronic device 17 is an integrated passive device (IPD). In some embodiments, the electronic device 17 is a logic device, graphics processing unit (GPU), application processing (AP) device, memory device, dynamic random access memory (DRAM) device, static random access memory (SRAM) device, high bandwidth memory (HBM) device or the like. In some embodiments, the electronic device 17 has a top cross section (a cross section from a top view of the interconnect structure 1) in a quadrilateral, a rectangular or a square shape.

In some embodiments, the first polymeric layer 15 is disposed over the first substrate 11. In some embodiments, the first polymeric layer 15 is disposed over the electronic device 17. In some embodiments, the first polymeric layer 15 is disposed on the first surface 111 of the first substrate 11 and within the cavity 117. In some embodiments, the first polymeric layer 15 fills the cavity 117. In some embodiments, the first polymeric layer 15 fills a gap between the electronic device 17 and the first substrate 11. In some embodiments, the first polymeric layer 15 surrounds the electronic device 17 and is disposed between the electronic device 17 and the first substrate 11. In some embodiments, the first polymeric layer 15 includes resin, ABF resin or epoxy.

In some embodiments, the second polymeric layer 14 is disposed between the first substrate 11 and the second substrate 12 and within the first recess 114. In some embodiments, the second polymeric layer 14 is in contact with the second surface 112 and the third surface 121. In some embodiments, the second polymeric layer 14 fills the first recess 114 of the first substrate 11. In some embodiments, the second polymeric layer 14 fills the second recess 124 of the second substrate 12. In some embodiments, the second polymeric layer 14 is in contact with the electronic device 17. In some embodiments, the second polymeric layer 14 includes prepreg (PPG). In some embodiments, the interconnect structure 1 includes an interface 145 between the first polymeric layer 15 and the second polymeric layer 14. In some embodiments, the interface 145 is coplanar with the second surface 112 of the first substrate 11. In some embodiments, a thickness of the second polymeric layer 14 is about 60 um. In some embodiments, the thickness of the second polymeric layer 14 is about 40 um to 80 um.

In some embodiments as shown in FIG. 1A, the second polymeric layer 14 surrounds and contacts with the second protrusions 126. In some embodiments, the second polymeric layer 14 is disposed between adjacent second protrusions 126. In some embodiments, the second polymeric layer 14 is conformal to surfaces of the second protrusions 126.

Referring back to FIG. 1, in some embodiments, several conductive lines 151 are disposed over the first surface 111 of the first substrate 11. In some embodiments, the conductive lines 151 are covered by the first polymeric layer 15. In some embodiments, at least one of the conductive lines 151 is electrically connected to the electronic device 17. In some embodiments, each of the conductive lines 151 includes gold, silver, copper, nickel, tungsten, aluminum, titanium, palladium and/or alloys thereof. In some embodiments, at least one of the conductive lines 151 has a conductive surface 151s.

In some embodiments, a dimension of the interconnect structure 1 is about 10×10 mm to about 99×99 mm. In some embodiments, a total thickness T of the interconnect structure 1 is about 200 um to about 2 mm. The interconnect structure 1 includes more than one substrates (11 and 12) stacking over each other. Thus, the first polymeric layer 15 can smoothly flow into the cavity 117, and the cavity 117 can be easily filled by the first polymeric layer 15. As such, development of void in the first polymeric layer 15 can be minimized or prevented, even though the total thickness T of the interconnect structure 100 is substantially greater than 200 um.

Figure 2:
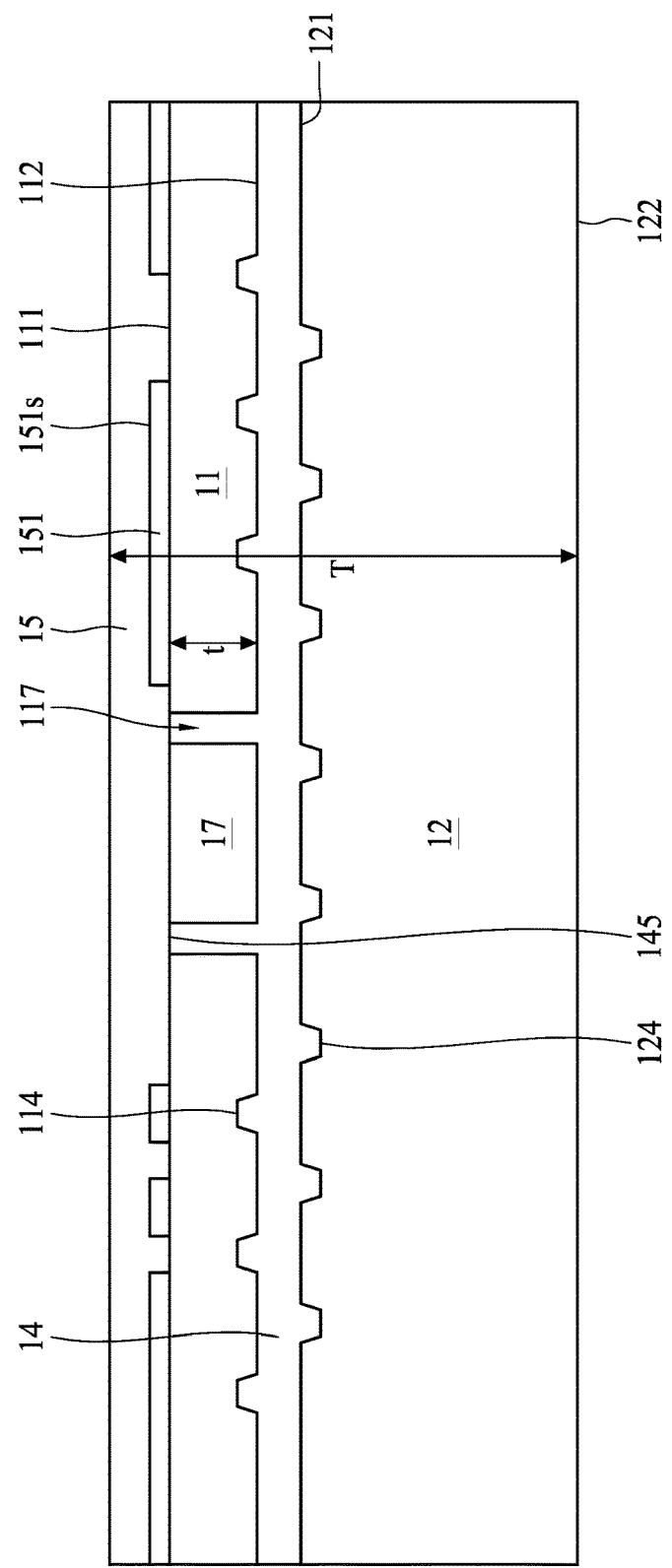
FIG. 2 is a cross-sectional view of an interconnect structure in accordance with some embodiments of the present disclosure.

FIG. 2 is a cross sectional view of an interconnect structure 2 in accordance with some embodiments of the present disclosure. In some embodiments, the interconnect structure 2 has similar configurations as the interconnect structure 1 illustrated in FIG. 1. In some embodiments, the second polymeric layer 14 is disposed between the first substrate 11 and the second substrate 12 and disposed within the cavity 17. In some embodiments, the second polymeric layer 14 fills the cavity 117. In some embodiments, the second polymeric layer 14 fills a gap between the electronic device 17 and the first substrate 11. In some embodiments, the second polymeric layer 14 surrounds the electronic device 17 and is disposed between the electronic device 17 and the first substrate 11. In some embodiments, the interface 145 between the first polymeric layer 15 and the second polymeric layer 14 is coplanar with the first surface 111 of the first substrate 11. In some embodiments, the interface 145 between the first polymeric layer 15 and the second polymeric layer 14 is coplanar with the conductive surface 151s of the conductive line 151.

Figure 3:
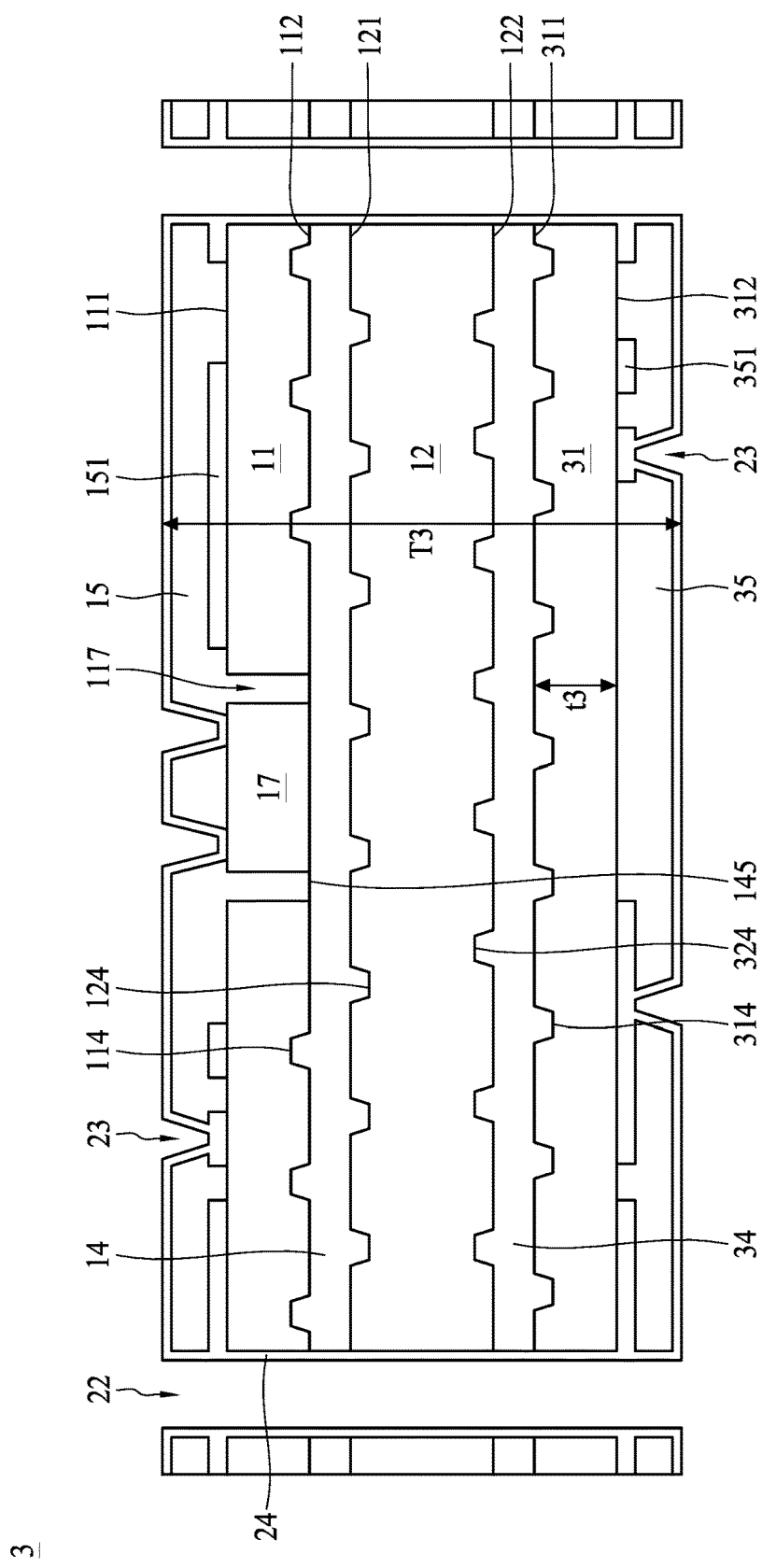
FIG. 3 is a cross-sectional view of an interconnect structure in accordance with some embodiments of the present disclosure.

FIG. 3 is a cross sectional view of an interconnect structure 3 in accordance with some embodiments of the present disclosure. In some embodiments, the interconnect structure 3 has similar configurations as the interconnect structures 1 and 2 illustrated in FIG. 1 to FIG. 2, and similar features are denoted with same numeral annotations.

In some embodiments, the interconnect structure 3 includes several third recesses 324 disposed at the fourth surface 122 of the second substrate 12. In some embodiments, the third recesses 324 are recessed from the fourth surface 122 and extended from the fourth surface 122 towards the third surface 121. In some embodiments, the third recesses 324 do not penetrate through the second substrate 12. In some embodiments, the third recesses 324 are configured to increase surface area of the second substrate 12.

In some embodiments, the interconnect structure 3 includes a third substrate 31 disposed below the second substrate 12. In some embodiments, the third substrate 31 is disposed opposite to the fourth surface 122 of the second substrate 12. In some embodiments, the third substrate 31 is a core substrate. In some embodiments, the third substrate 31 includes organic material. In some embodiments, the third substrate 31 includes epoxy, resin or glass fiber. In some embodiments, the third substrate 31, the second substrate 12 and the first substrate 11 include same or different material. In some embodiments, a thickness t3 of the third substrate 31 is substantially smaller than or equal to 200 um. In some embodiments, the thickness t3 of the third substrate 31 is about 100 um to about 200 um.

In some embodiments, the third substrate 31 includes a fifth surface 311 and a sixth surface 312 opposite to the fifth surface 311. In some embodiments, the fifth surface 311 faces to the fourth surface 122 of the second substrate 12. In some embodiments, the third substrate 31 includes several fourth recesses 314. In some embodiments, the fourth recesses 314 are recessed from the fifth surface 311 and extended from the fifth surface 311 towards the sixth surface 312. In some embodiments, the fourth recesses 314 do not penetrate through the third substrate 31. In some embodiments, the fourth recesses 314 are configured to increase surface area of the third substrate 31.

In some embodiments, the interconnect structure 3 includes a third polymeric layer 34 disposed between the second substrate 12 and the third substrate 31, and within the third recess 324 and the fourth recess 314. In some embodiments, the third polymeric layer 34 is in contact with the fourth surface 122 and the fifth surface 311. In some embodiments, the third polymeric layer 34 fills the third recess 324 of the second substrate 12. In some embodiments, the third polymeric layer 34 fills the fourth recess 314 of the third substrate 31. In some embodiments, the third polymeric layer 34 includes prepreg (PPG). In some embodiments, a thickness of the third polymeric layer 34 is about 60 um. In some embodiments, the thickness of the third polymeric layer 34 is about 40 um to 80 um.

In some embodiments, the interconnect structure 3 includes a fourth polymeric layer 35 disposed below the third substrate 31. In some embodiments, the fourth polymeric layer 35 is in contact with the sixth surface 312. In some embodiments, the fourth polymeric layer 35 includes resin, ABF resin or epoxy.

In some embodiments, the interconnect structure 3 includes several second conductive lines 351. The second conductive lines 351 are disposed under the sixth surface 312 of the third substrate 31. In some embodiments, the second conductive lines 351 are covered by the fourth polymeric layer 35. In some embodiments, each of the second conductive lines 351 includes gold, silver, copper, nickel, tungsten, aluminum, titanium, palladium and/or alloys thereof.

In some embodiments, the interconnect structure 3 includes a through hole 22. In some embodiments, the through hole 22 is extended through the first polymeric layer 15, the first substrate 11, the second polymeric layer 14, the second substrate 12, the third polymeric layer 34, the third substrate 31 and the fourth polymeric layer 35. In some embodiments, the through hole 22 is filled by a plugging material (for example, the plugging material 222 in an embodiment shown in FIG. 9). In some embodiments, the plugging material is a conductive material such as gold, silver, copper, nickel, tungsten, aluminum, titanium, palladium and/or alloys thereof. In some embodiments, the plugging material is an insulating material such as resin or epoxy. In some embodiments, the plugging material is a semiconductor material.

In some embodiments, a via 23 is disposed over the conductive line 151, disposed below the second conductive line 351 or disposed over the electronic device 17. In some embodiments, the via 23 is extended through at least a portion of the first polymeric layer or a portion of the fourth polymeric layer 35. In some embodiments, the via 23 includes conductive material such as copper, silver, nickel, aluminum, gold, titanium or tungsten, etc.

In some embodiments, a conductive layer 24 is disposed over the first polymeric layer 15. In some embodiments, the conductive layer 24 is disposed under the fourth polymeric layer 35. In some embodiments, the conductive layer 24 is disposed conformal to a sidewall of the through hole 22 and a sidewall of the via 23. In some embodiments, the conductive layer 24 is electrically connected to the electronic device 17, the conductive line 151, or the second conductive line 351. In some embodiments, the electronic device 17 is electrically connected to the outside by the conductive line 151, the conductive layer 24, or the second conductive line 351. In some embodiments, the electronic device 17, the conductive line 151 and the second conductive line 351 are electrically connected by the conductive layer 24. In some embodiments, a total thickness T3 of the interconnect structure 3 is about 200 um to about 2 mm, for example, about 1120 um.

Figure 4:
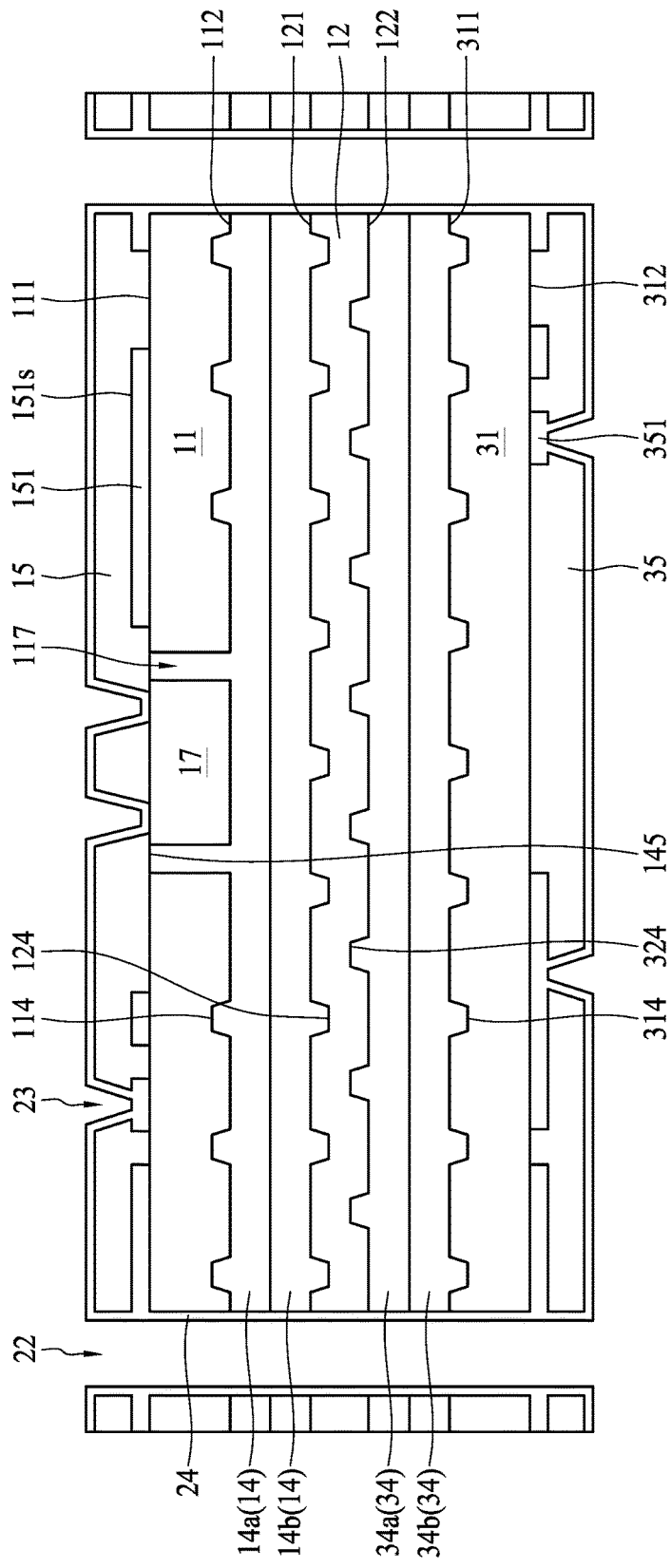
FIG. 4 is a cross-sectional view of an interconnect structure in accordance with some embodiments of the present disclosure.

FIG. 4 is a cross sectional view of an interconnect structure 4 in accordance with some embodiments of the present disclosure. In some embodiments, the interconnect structure 4 has similar configurations as the interconnect structures 1 to 3 illustrated in FIG. 1 to FIG. 3, and similar features are denoted with same numeral annotations.

In some embodiments, the interface 145 between the first polymeric layer 15 and the second polymeric layer 14 is coplanar with the first surface 111 of the first substrate 11. In some embodiments, the interface 145 between the first polymeric layer 15 and the second polymeric layer 14 is coplanar with the conductive surface 151s of the conductive line 151. In some embodiments, the second polymeric layer 14 includes two polymeric layers 14a and 14b, that respectively fills the first recess 114 and the second recess 124. In some embodiments, the third polymeric layer 34 includes two polymeric layers 34a and 34b, that respectively fills the third recess 324 and the fourth recess 314. A thickness of the polymeric layers 14a, 14b, 34a or 34b can be about 30 um, for example, about 10 um to 40 um.

Figure 5:
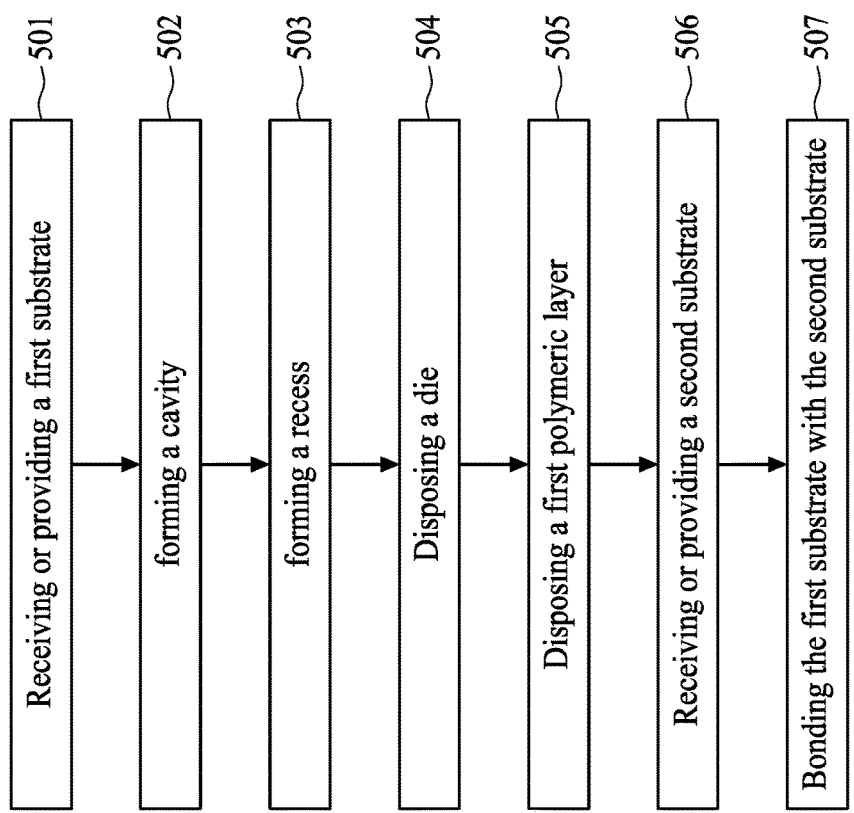
FIG. 5 is a flow diagram of a method of manufacturing an interconnect structure in accordance with some embodiments of the present disclosure.

FIG. 5 is an embodiment of a method 5 of manufacturing an interconnect structure. The method 5 includes a number of operations (501, 502, 503, 504, 505, 506, and 507). The operation of the method 5 is not limited to the sequence order represented in accordance to the embodiment as shown in FIG. 5. For instance, operation 503 can precede operation 502.

Figure 6A:
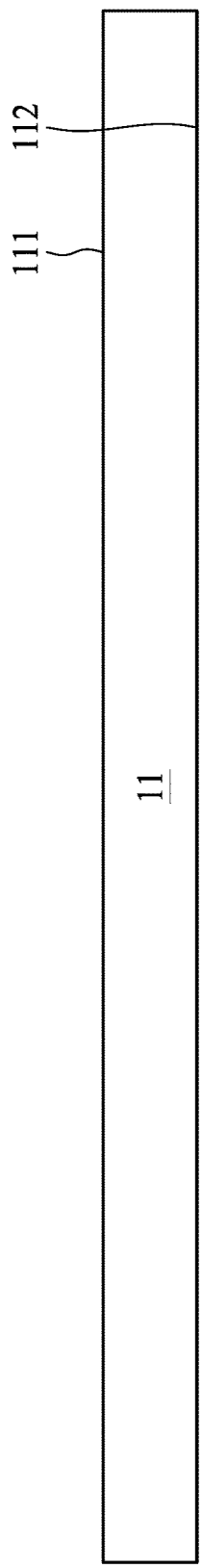
FIGS. 6A-6Q are cross-sectional views of manufacturing an interconnect structure by a method of FIG. 5 in accordance with some embodiments of the present disclosure.

In operation 501, a first substrate 11 is provided or received as shown in FIG. 6A. In some embodiments, the first substrate 11 has a first surface 111 and a second surface 112. In some embodiments, the first substrate 11 has similar configuration as the one described above or illustrated in any one of FIG. 1 to FIG. 4.

In operation 502, a portion of the first substrate 11 is removed to form a cavity 117 extended through the first substrate 11, as shown in FIG. 6B. In some embodiments, the cavity 117 is formed to have a thickness same as the thickness of the first substrate 11. In some embodiments, the cavity 117 is formed by sawing, laser drilling, wet or dry etching, or any other suitable operations. In some embodiments, the cavity 117 has similar configuration as the one described above or illustrated in any one of FIG. 1 to FIG. 4.

Figure 6C:
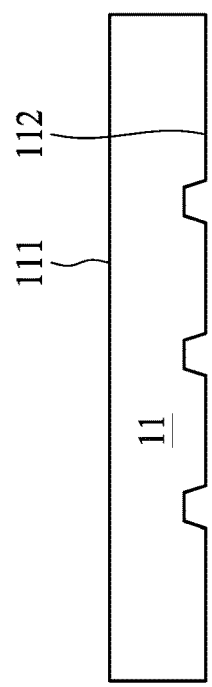
Figure 6C:
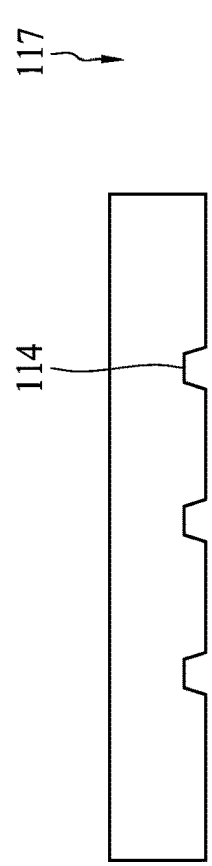

In operation 503, a portion of the first substrate 11 is removed to form a first recess 114 as shown in FIG. 6C. In some embodiments, the first recess 114 extending from the second surface 112 towards the first surface 111 is formed. In some embodiments, the recess 114 is formed by laser drilling, wet or dry etching, or any other suitable operations. In some embodiments, the first recess 114 has similar configuration as the one described above or illustrated in any one of FIG. 1 to FIG. 4.

In some embodiments, the operation 503 can be performed prior to the operation 502.

Figure 6D:
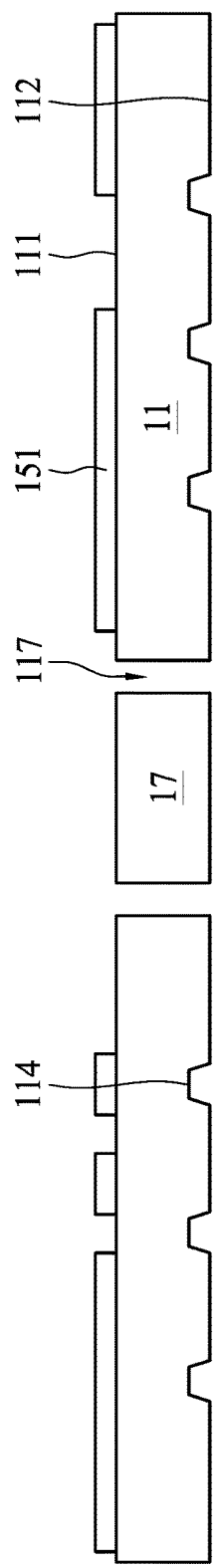

In operation 504, an electronic device 17 is disposed within the cavity 117 as shown in FIG. 6D. In some embodiments, the electronic device 17 is a passive or active device. In some embodiments, a supporting member such as a carrier or a tape (not shown) may be used to support the first substrate 11 during disposing of the electronic device 17. In some embodiments, the electronic device 17 has similar configuration as the one described above or illustrated in any one of FIG. 1 to FIG. 4.

In some embodiments, a conductive line 151 is formed over the substrate 11. In some embodiments, the conductive line 151 is formed prior to the operation 502 or the operation 503. In some embodiments, the conductive line 151 is formed after the operation 502 or the operation 503. In some embodiments, the conductive line 151 is formed by electroplating, sputtering, or any other suitable operations. In some embodiments, the conductive line 151 includes gold, silver, copper, nickel, tungsten, aluminum, titanium, palladium and/or alloys thereof. In some embodiments, the conductive line 151 has similar configuration as the one described above or illustrated in any one of FIG. 1 to FIG. 4.

Figure 6E:
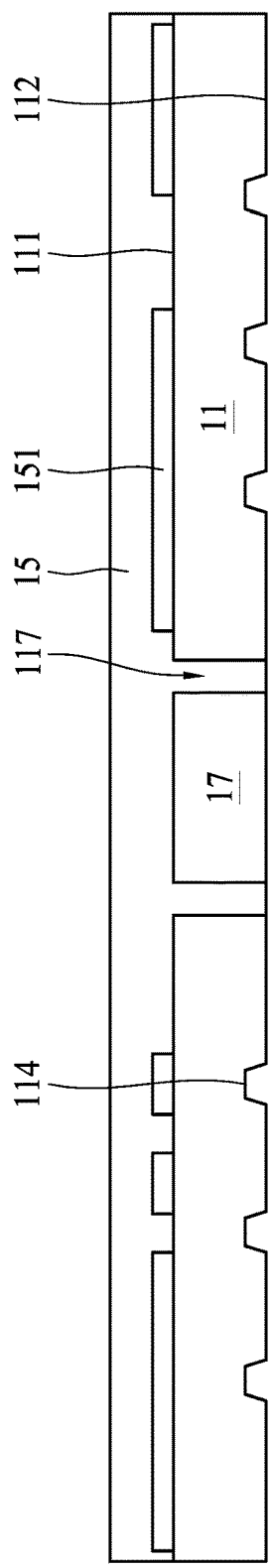

In operation 505, a first polymeric layer 15 is disposed over the first surface 111 as shown in FIG. 6E. In some embodiments, the first polymeric layer 15 covers the electronic device 17 and is disposed between the first substrate 11 and the electronic device 17. In some embodiments, the disposing of the first polymeric layer 15 includes flowing the first polymeric layer 15 into the cavity 17. In some embodiments, the first polymeric layer 15 is disposed by spin coating or any other suitable operations. In some embodiments, the first polymeric layer 15 has similar configuration as the one described above or illustrated in any one of FIGS. 1, 1A and 3.

Figure 6F:
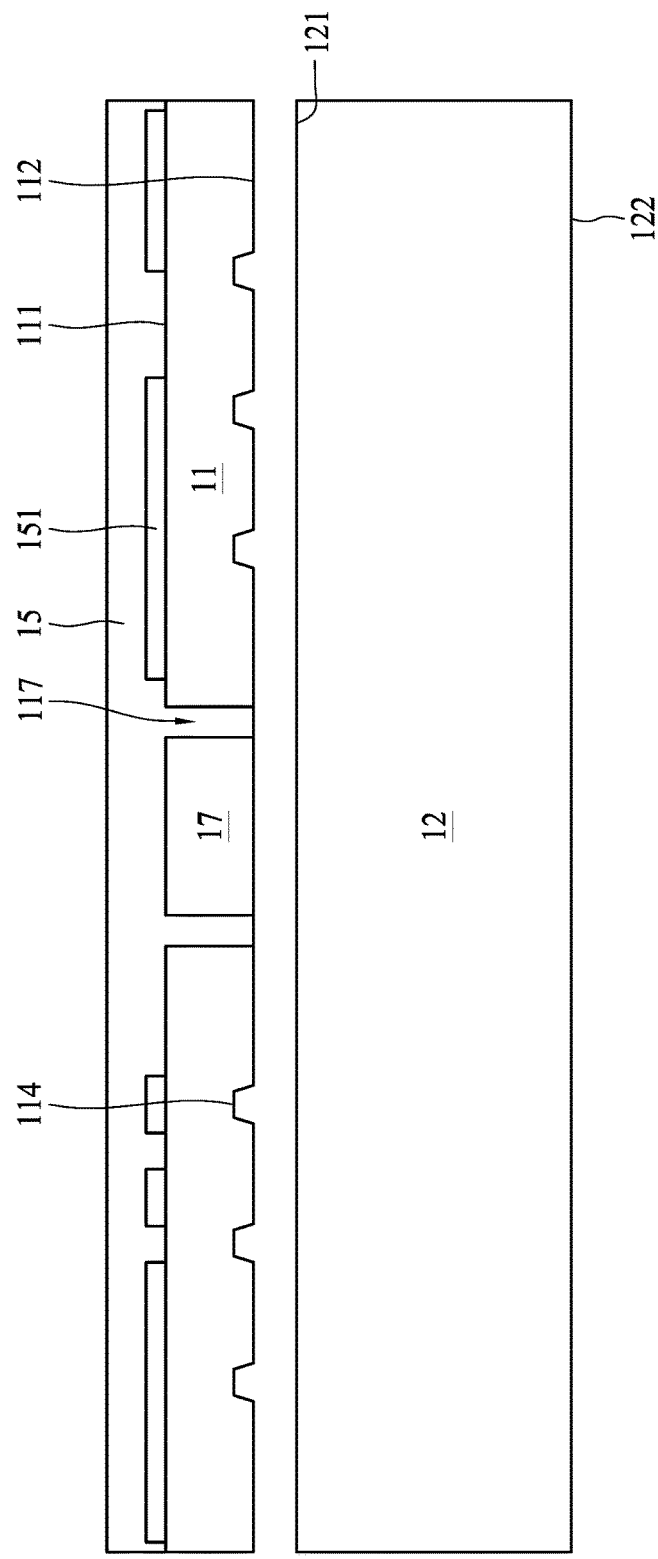

In operation 506, a second substrate 12 is provided or received as shown in FIG. 6F. In some embodiments, the second substrate 12 has a third surface 121 and a fourth surface 122. In some embodiments, the second substrate 12 has similar configuration as the one described above or illustrated in any one of FIG. 1 to FIG. 4.

Figure 6G:
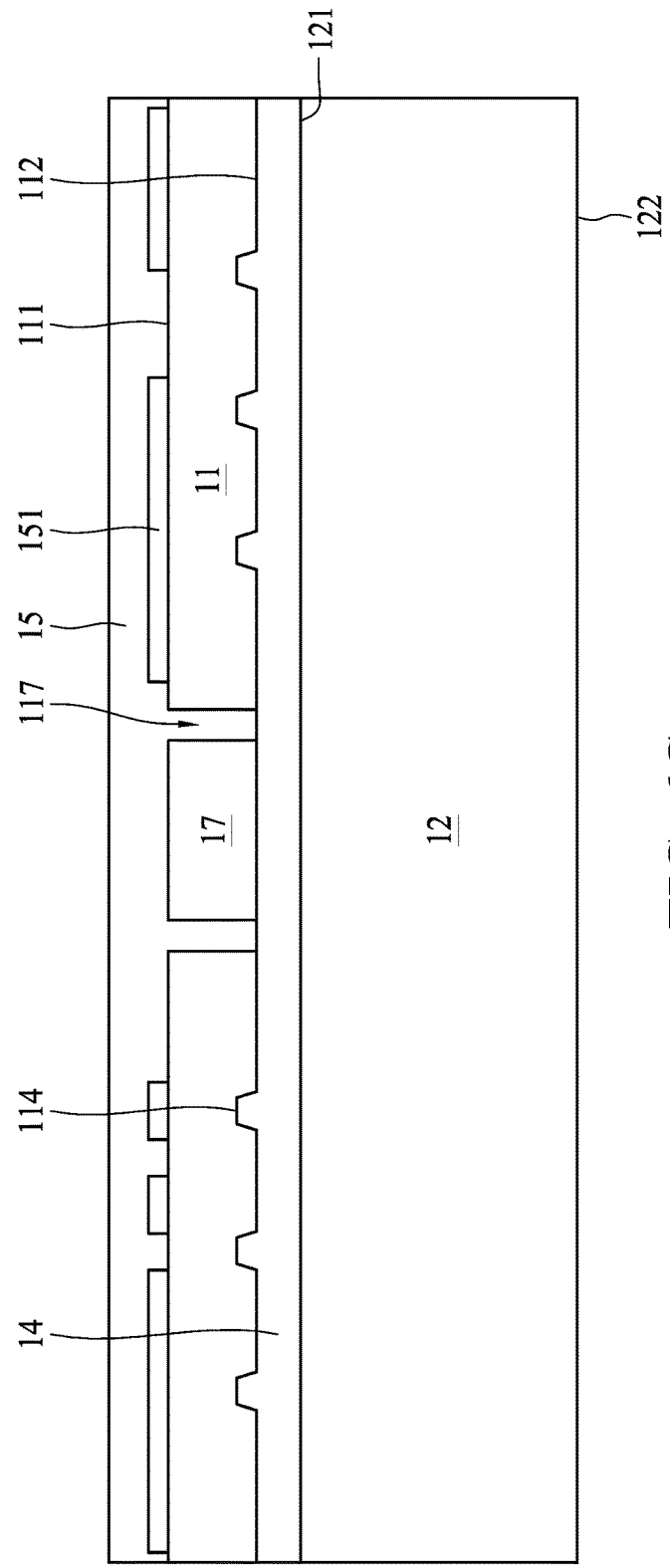

In operation 507, the first substrate 11 and the second substrate 12 are bonded by a second polymeric layer 14, as shown in FIG. 6G. In some embodiments, the second polymeric layer 14 is disposed between the first substrate 11 and the second substrate 12 and within the recess 114. In some embodiments, the second polymeric layer 14 is bonded with the second surface 112 and the third surface 121. In some embodiments, the bonding of the first substrate 11 with the second substrate 12 includes flowing the second polymeric layer 14 between the first substrate 11 and the second substrate 12. In some embodiments, the bonding of the first substrate 11 with the second substrate 12 includes hot pressing the first substrate 11 and the second substrate 12 towards each other, or any other suitable operations. In some embodiments, the second polymeric layer 14 has similar configuration as the one described above or illustrated in any one of FIGS. 1, 1A and 3.

Figure 6H:
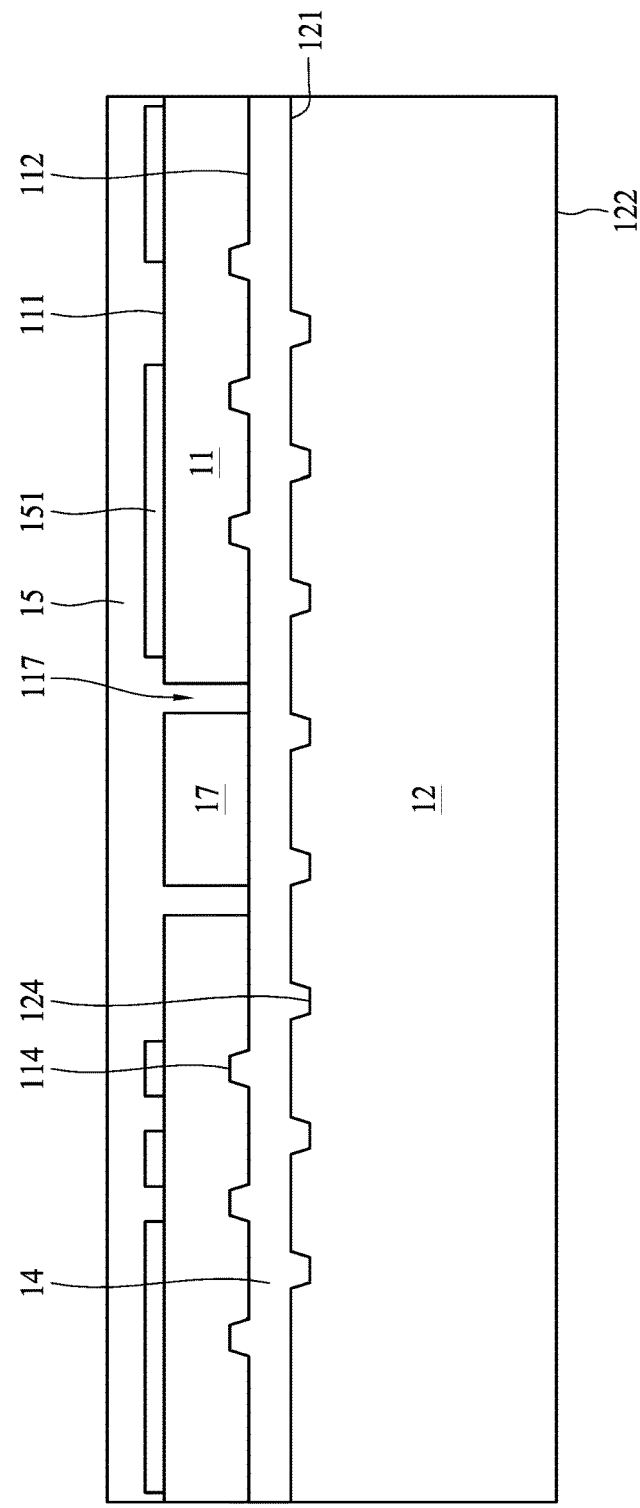

In some embodiments, several second recesses 124 are formed at the third surface 121 of the second substrate 12, and then the second substrate 12 is provided (the operation 506) and the first substrate 11 is bonded over the second substrate 12 (the operation 507), as shown in FIG. 6H. In some embodiments, the second recesses 124 are formed by removing several portions of the second substrate 12. In some embodiments, the second recess 124 extending from the third surface 121 towards the fourth surface 122 are formed. In some embodiments, the second recesses 124 are formed by laser drilling, wet or dry etching, or any other suitable operations. In some embodiments, the second recesses 124 have similar configuration as the one described above or illustrated in any one of FIG. 1 to FIG. 4.

Figure 6I:
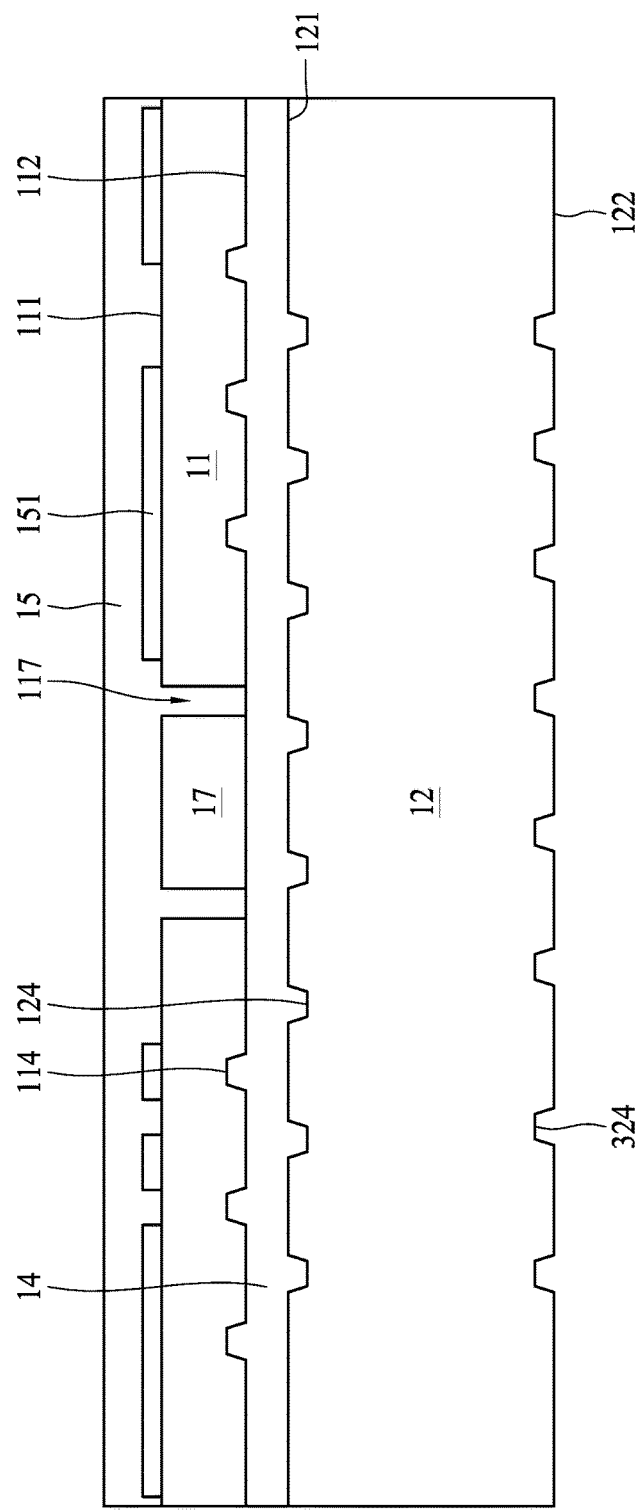

In some embodiments, several third recesses 324 are formed at the fourth surface 122 of the second substrate 12, as shown in FIG. 6I. In some embodiments, the third recesses 324 are formed by removing several portions of the second substrate 12. In some embodiments, the third recesses 324 extending from the fourth surface 122 towards the third surface 121 are formed. In some embodiments, the third recesses 324 are formed by laser drilling, wet or dry etching, or any other suitable operations. In some embodiments, the third recesses 324 have similar configuration as the one described above or illustrated in any one of FIG. 3 to FIG. 4.

Figure 6J:
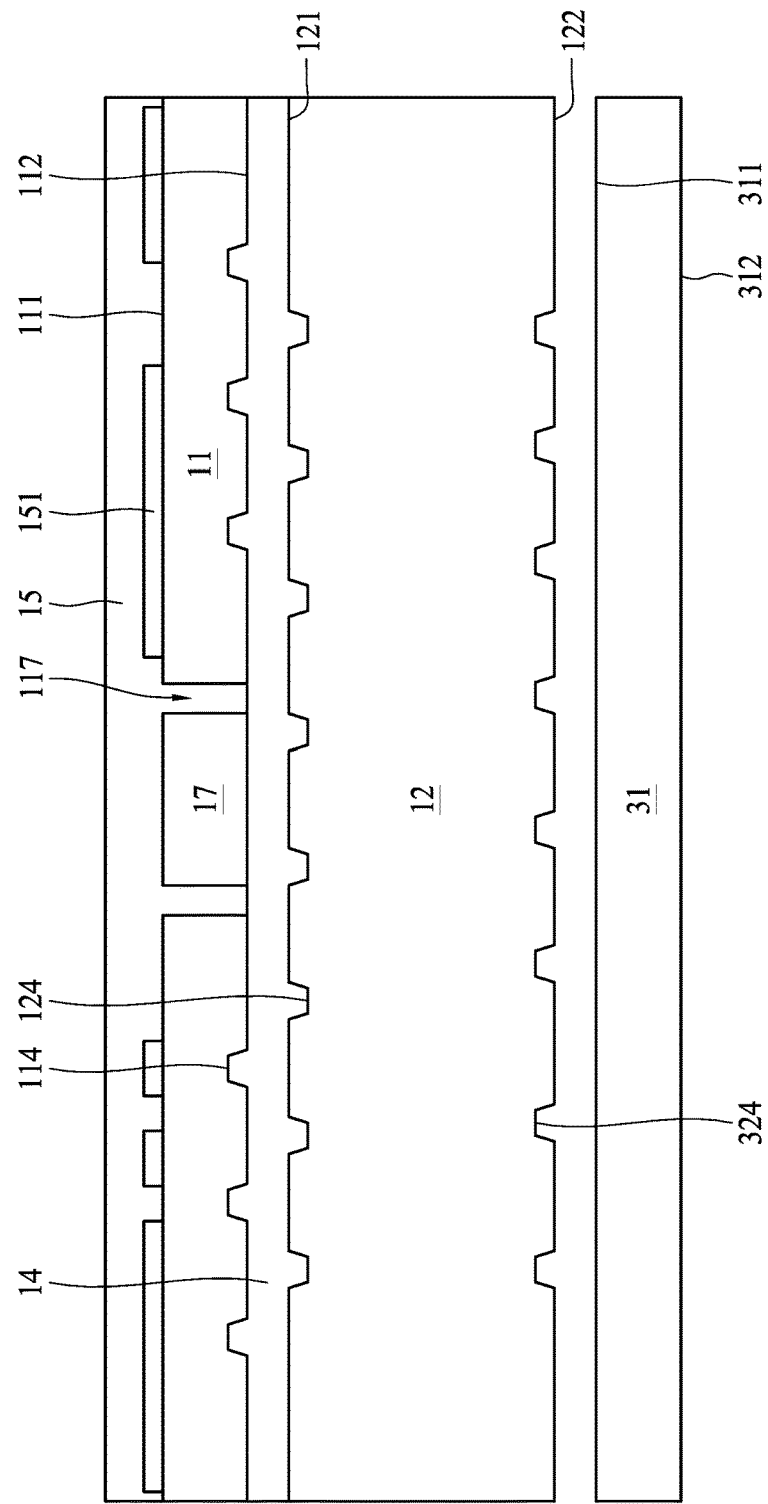

In some embodiments, a third substrate 31 is provided or received as shown in FIG. 6J. In some embodiments, the third substrate 31 has a fifth surface 311 and a sixth surface 312. In some embodiments, the third substrate 31 has similar configuration as the one described above or illustrated in any one of FIG. 3 to FIG. 4.

Figure 6K:
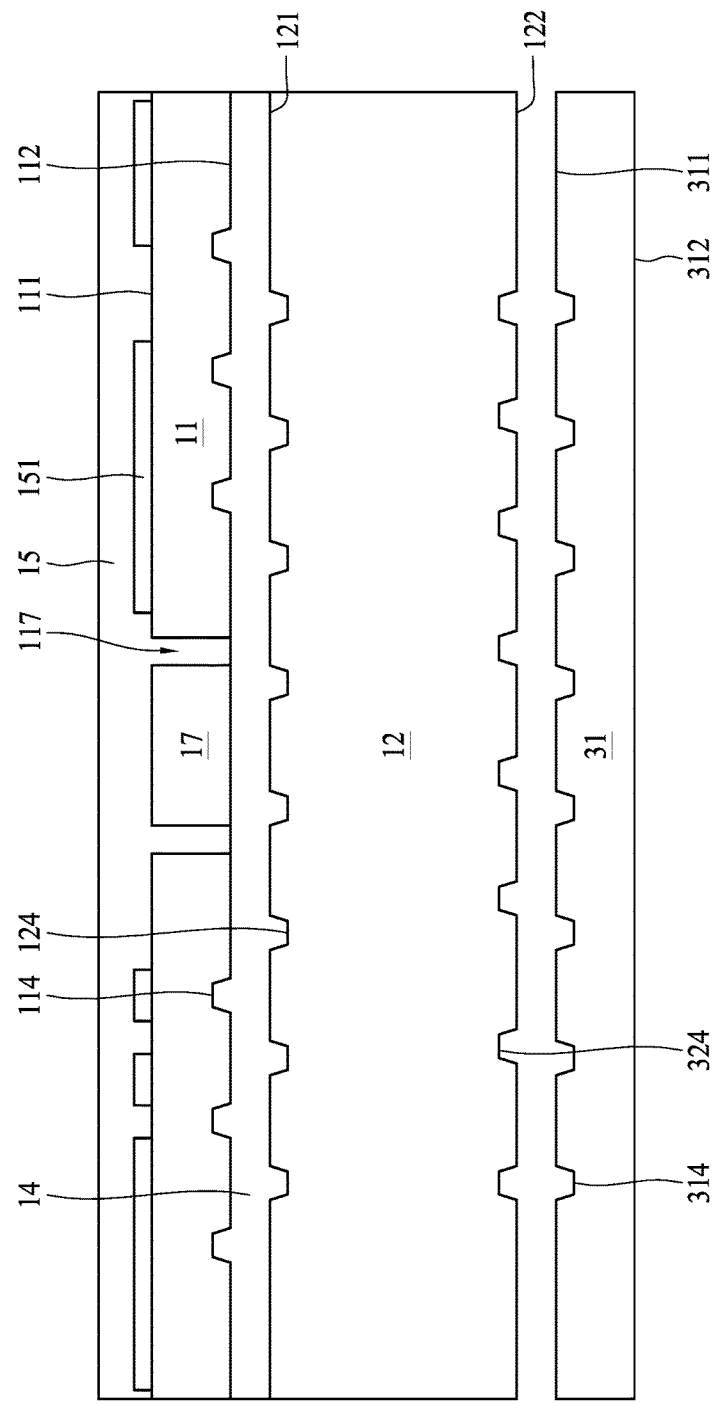

In some embodiments, several fourth recesses 314 are formed at the fifth surface 311 of the third substrate 31, as shown in FIG. 6K. In some embodiments, the fourth recesses 314 are formed by removing several portions of the third substrate 31. In some embodiments, the fourth recesses 314 extending from the fifth surface 311 towards the sixth surface 312 are formed. In some embodiments, the fourth recesses 314 are formed by laser drilling, wet or dry etching, or any other suitable operations. In some embodiments, the fourth recesses 314 have similar configuration as the one described above or illustrated in any one of FIG. 3 to FIG. 4.

Figure 6L:
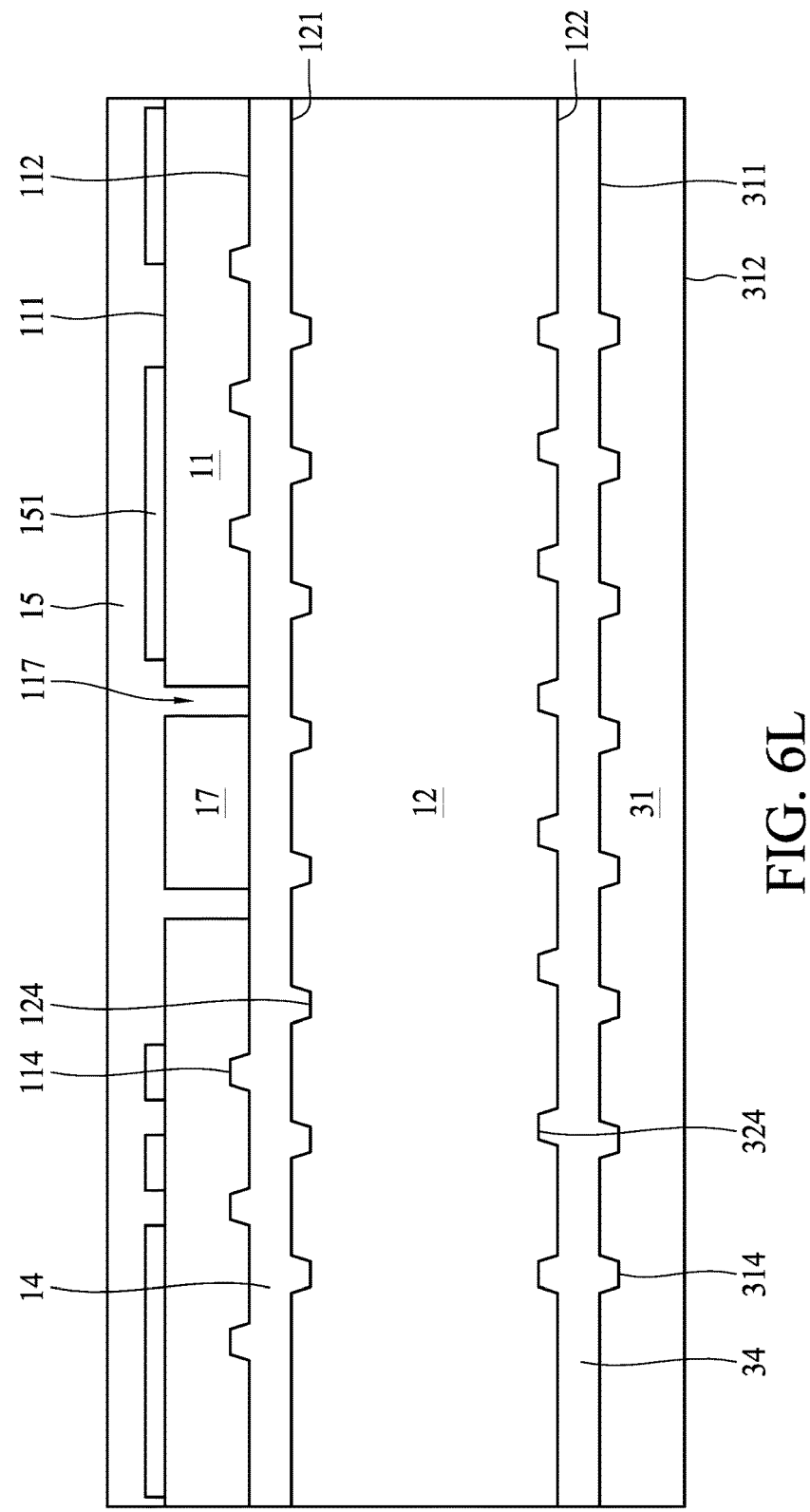

In some embodiments, a third polymeric layer 34 is disposed between the second substrate 12 and the third substrate 31 to bond the second substrate 12 with the third substrate 31 as shown in FIG. 6L. In some embodiments, the third polymeric layer 34 is disposed within the third recess 324 and the fourth recess 314. In some embodiments, the third polymeric layer 34 is bonded with the fourth surface 122 and the fifth surface 311. In some embodiments, the bonding of the second substrate 12 with the third substrate 31 includes flowing the third polymeric layer 34 between the second substrate 12 and the third substrate 31. In some embodiments, the bonding of the second substrate 12 with the third substrate 31 includes hot pressing the second substrate 12 and the third substrate 31 towards each other, or any other suitable operations. In some embodiments, the third polymeric layer 34 has similar configuration as the one described above or illustrated in any one of FIG. 3 to FIG. 4.

Figure 6M:
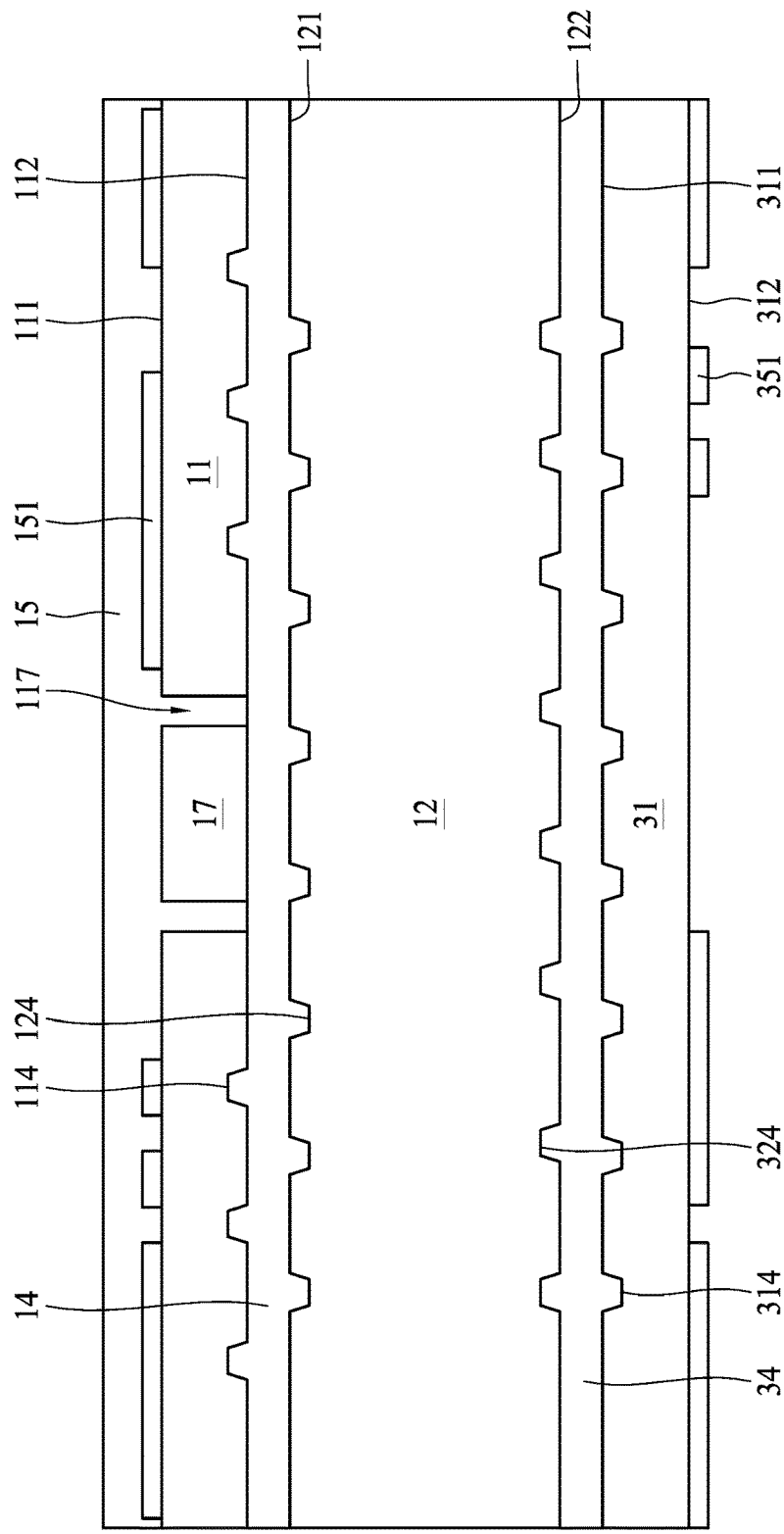

In some embodiments, a second conductive line 351 is formed under the sixth surface 312 of the third substrate 31 as shown in FIG. 6M. In some embodiments, the second conductive line 351 is formed prior to the bonding of the second substrate 12 with the third substrate 31. In some embodiments, the second conductive line 351 is formed after the bonding of the second substrate 12 with the third substrate 31. In some embodiments, the second conductive line 351 is formed by electroplating, sputtering, or any other suitable operations. In some embodiments, the second conductive line 351 includes gold, silver, copper, nickel, tungsten, aluminum, titanium, palladium and/or alloys thereof. In some embodiments, the second conductive line 351 has similar configuration as the one described above or illustrated in any one of FIG. 3 to FIG. 4.

Figure 6N:
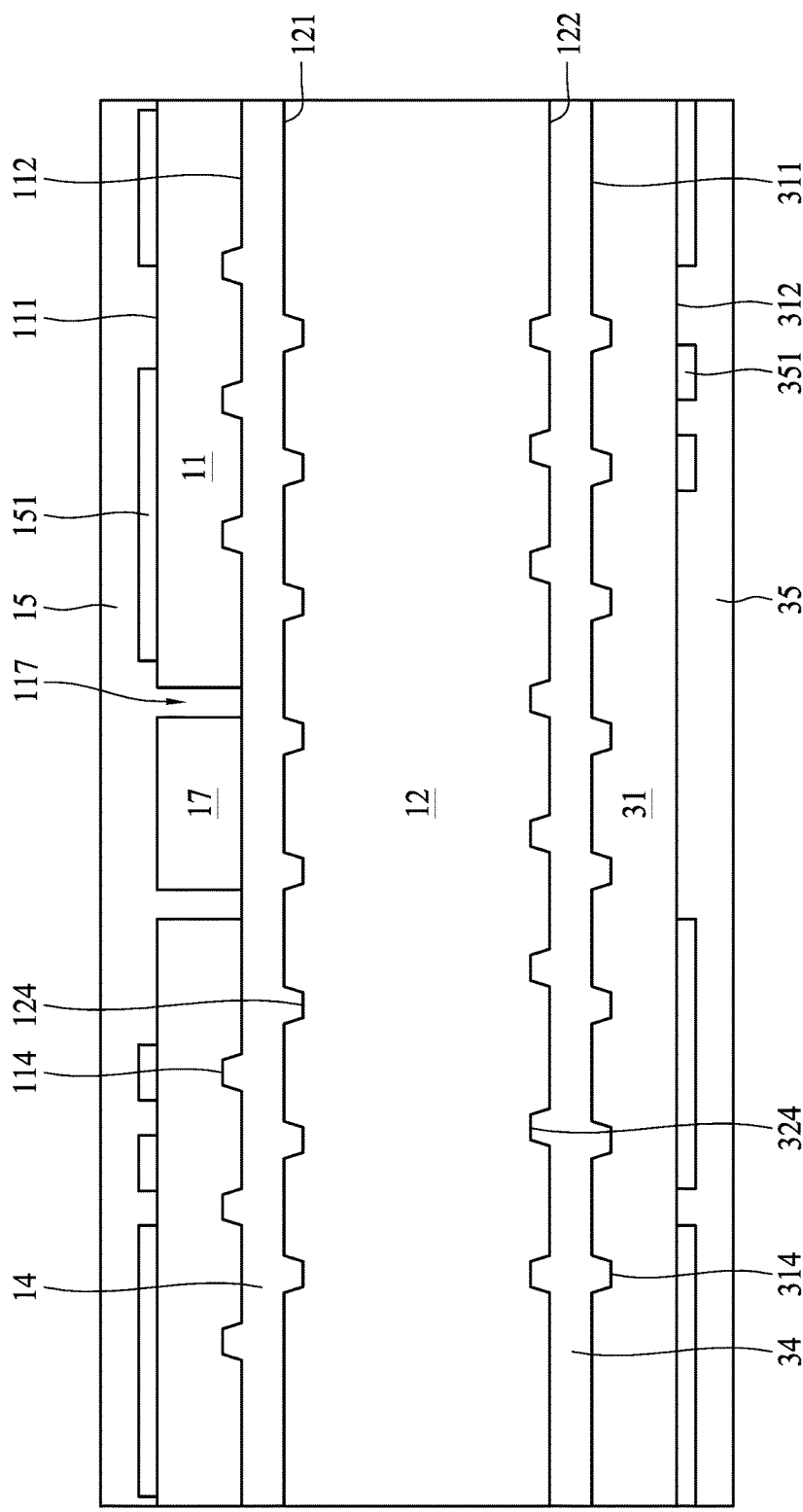

In some embodiments, a fourth polymeric layer 35 is disposed below the third substrate 31 as shown in FIG. 6N. In some embodiments, the fourth polymeric layer 35 covers the second conductive line 351. In some embodiments, the fourth polymeric layer 35 is disposed before the bonding of the third substrate 31 with the second substrate 12. In some embodiments, the fourth polymeric layer 35 is disposed by spin coating or any other suitable operations. In some embodiments, the fourth polymeric layer 35 has similar configuration as the one described above or illustrated in any one of FIG. 3 to FIG. 4.

Figure 6O:
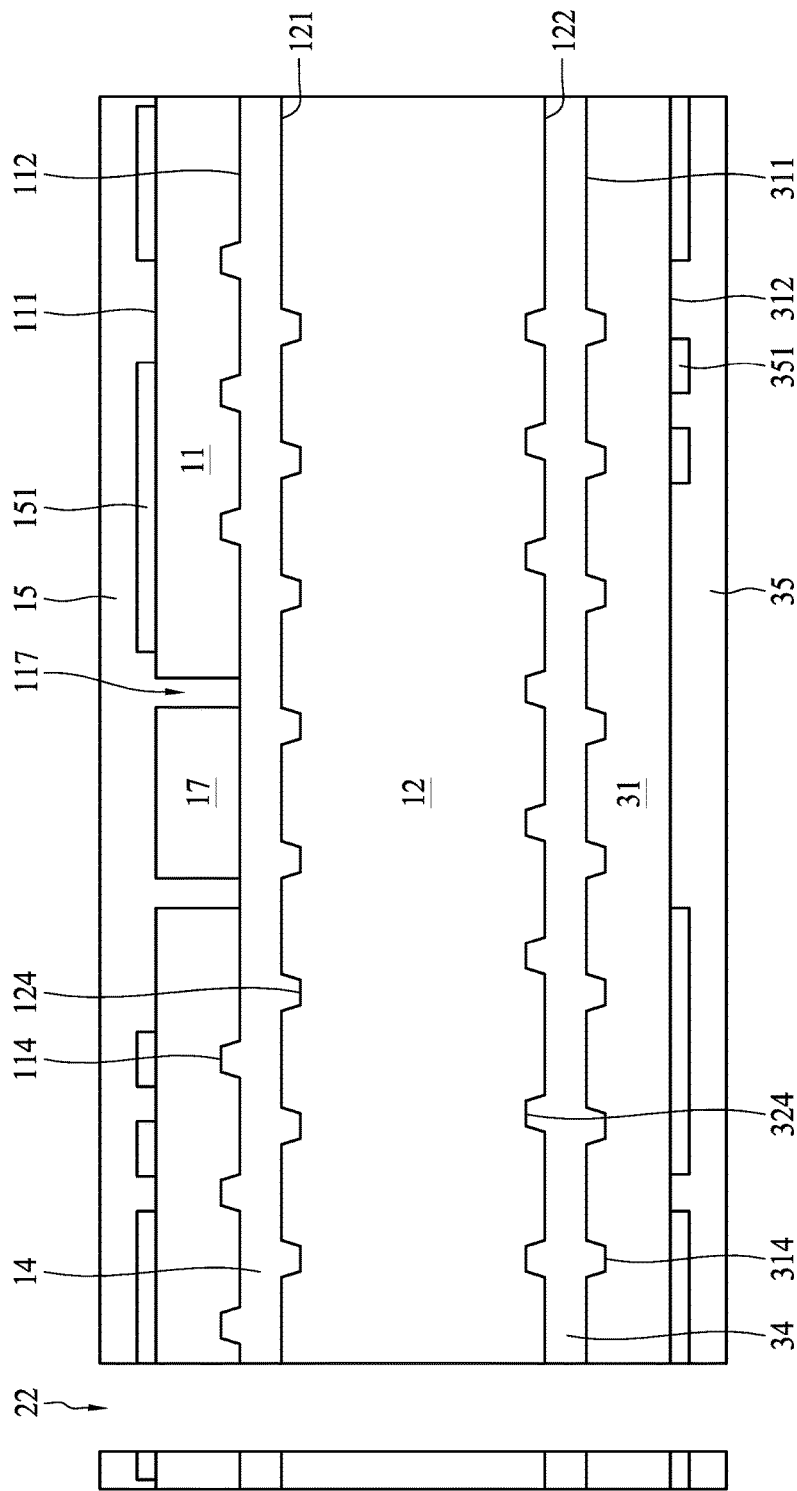

In some embodiments, a through hole 22 is formed as shown in FIG. 6O. In some embodiments, the through hole 22 extending through the first polymeric layer 15, the first substrate 11, the second polymeric layer 14, the second substrate 12, the third polymeric layer 34, the third substrate 31 and the fourth polymeric layer 35 is formed. In some embodiments, the through hole 22 is formed by laser drilling or any suitable operations. In some embodiments, the through hole 22 has similar configuration as the one described above or illustrated in any one of FIG. 3 to FIG. 4.

Figure 6P:
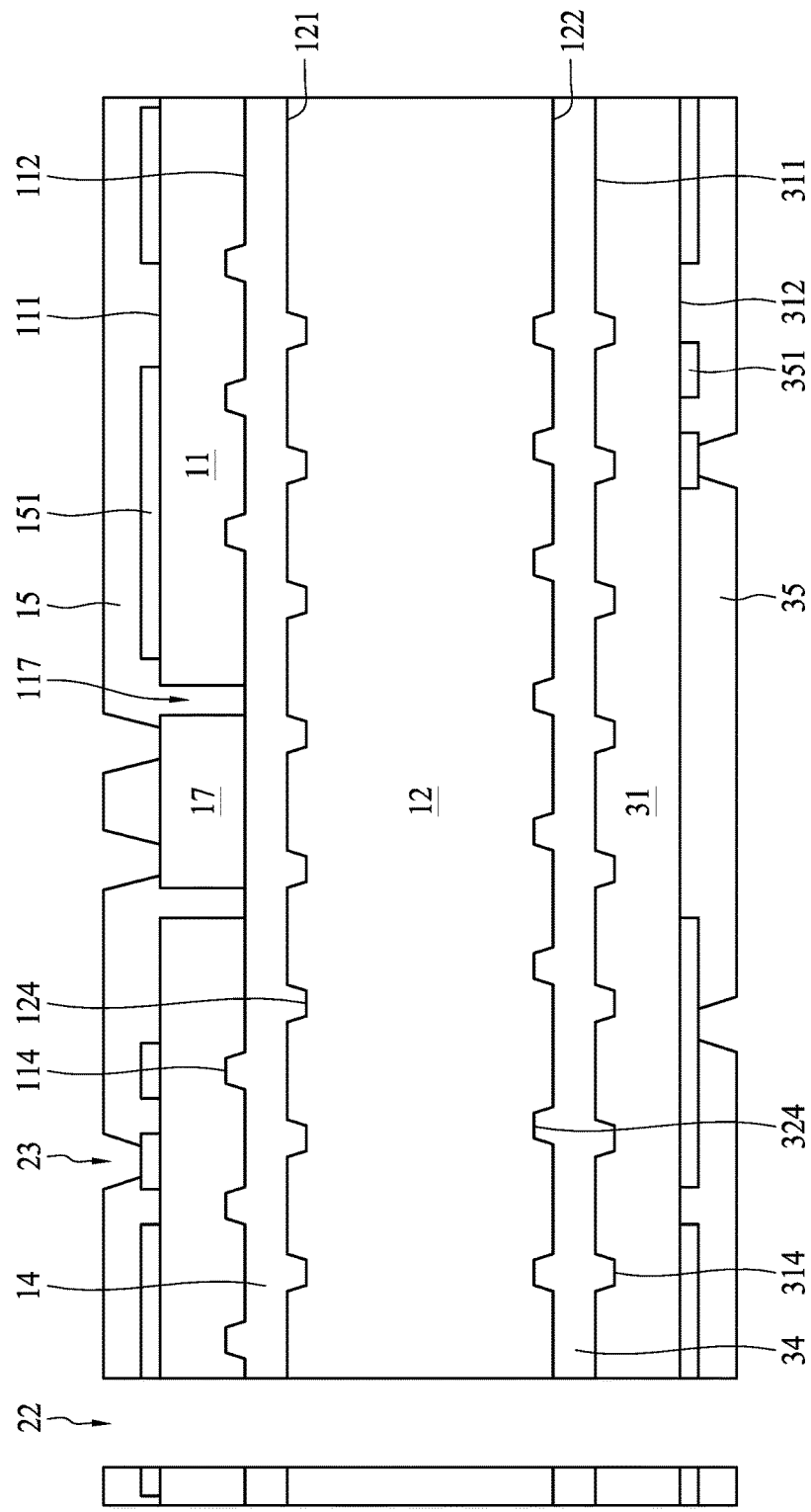

In some embodiments, a via 23 is formed as shown in FIG. 6P. In some embodiments, the via 23 is disposed over the conductive line 151, disposed below the second conductive line 351 or disposed over the electronic device 17. In some embodiments, the via 23 is formed by laser drilling or any suitable operations. In some embodiments, the via 23 has similar configuration as the one described above or illustrated in any one of FIG. 3 to FIG. 4.

Figure 6Q:
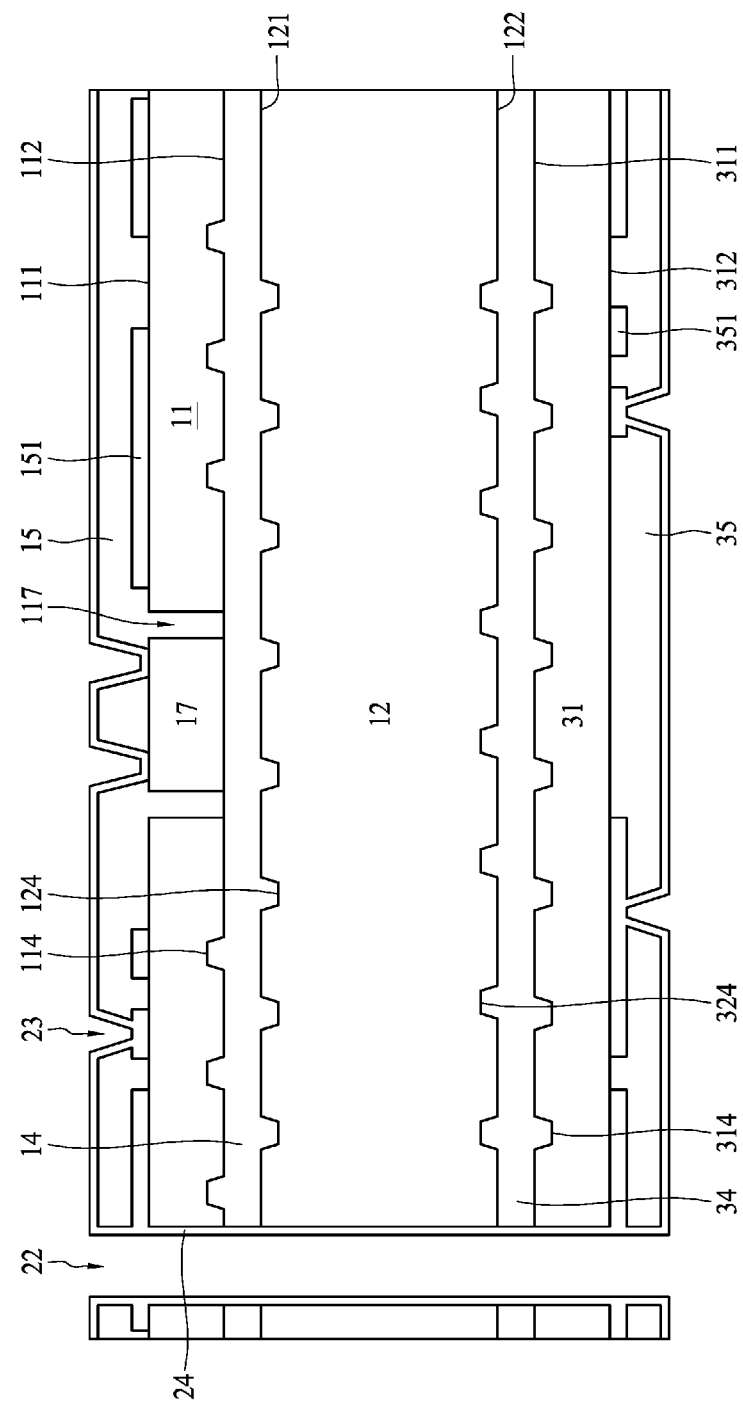

In some embodiments, a conductive layer 24 is disposed along a sidewall of the thorough hole 22, along a sidewall of the via 23, over the first polymeric layer 15 and below the fourth polymeric layer 35 as shown in FIG. 6Q. In some embodiments, the electronic device 17 is electrically connected to the conductive line 151 and the second conductive line 351 through the conductive layer 24. In some embodiments, the conductive layer 24 is formed by electroplating or any suitable operations. In some embodiments, the conductive layer 24 has similar configuration as the one described above or illustrated in any one of FIG. 3 to FIG. 4.

Figure 7:
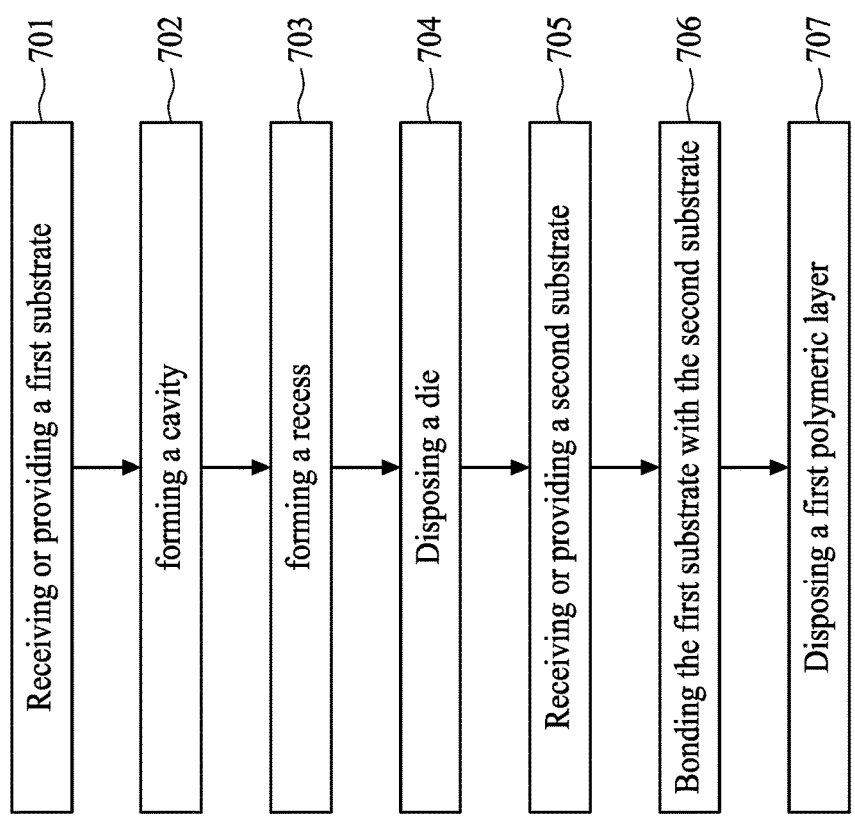
FIG. 7 is a flow diagram of a method of manufacturing an interconnect structure in accordance with some embodiments of the present disclosure.

FIG. 7 is another example of a method 7 of manufacturing the interconnect structure. The method 7 includes a number of operations (701, 702, 703, 704, 705, 706, and 707). The operation of the method 7 is not limited to the sequence order represented in accordance to the embodiment as shown in FIG. 7. For instance, operation 703 can precede operation 702.

Figure 8A:
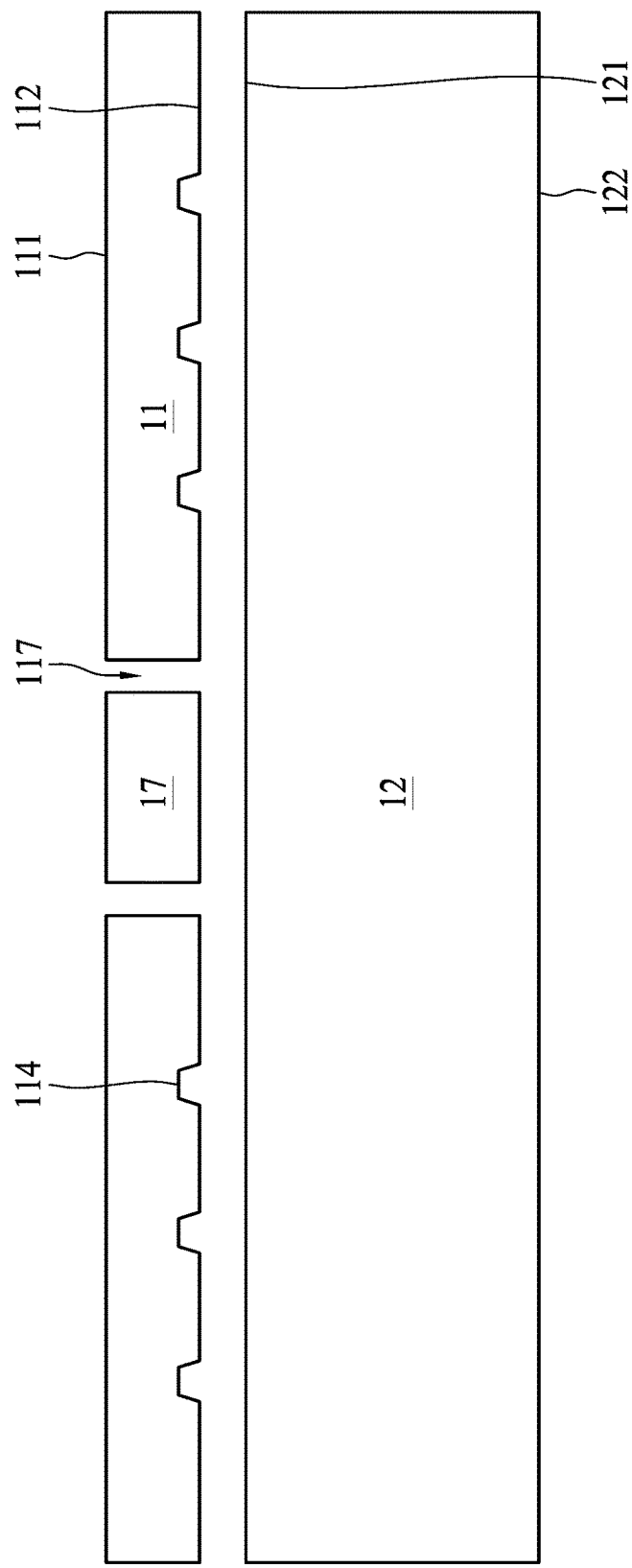
FIGS. 8A-8G are cross-sectional views of manufacturing an interconnect structure by a method of FIG. 7 in accordance with some embodiments of the present disclosure.

In some embodiments, operations 701, 702, 703 and 704 are same as operations 501, 502, 503 and 504. In operation 705, a second substrate 12 is received or provided as shown in FIG. 8A. In some embodiments, the operation 705 is same as the operation 506.

Figure 8B:
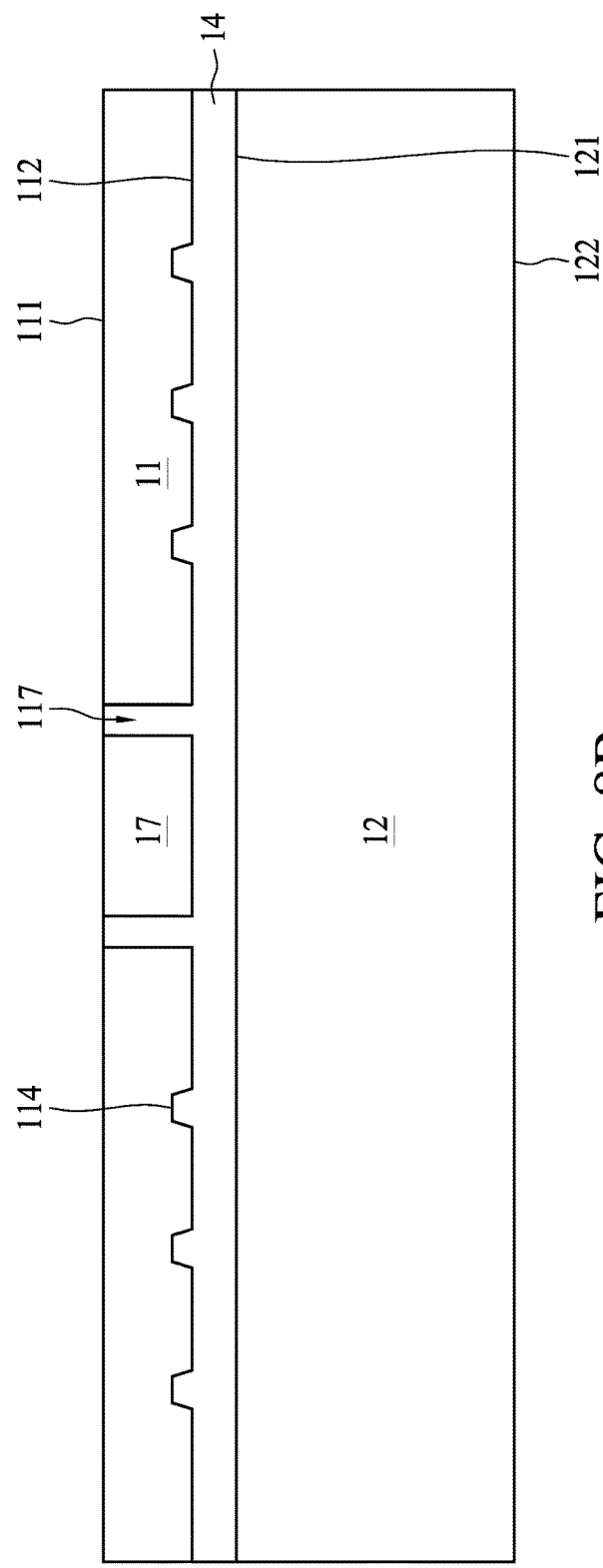

In operation 706, the first substrate 11 is bonded with the second substrate 12 by a second polymeric layer 14 as shown in FIG. 8B. In some embodiments, the operation 706 is similar to the operation 507. In some embodiments, the second polymeric layer 14 is disposed between the first substrate 11 and the electronic device 17. In some embodiments, the disposing of the second polymeric layer 14 includes flowing the second polymeric layer 14 into the cavity 17. In some embodiments, the second polymeric layer 14 has similar configuration as the one described above or illustrated in any one of FIGS. 2 and 4.

Figure 8C:
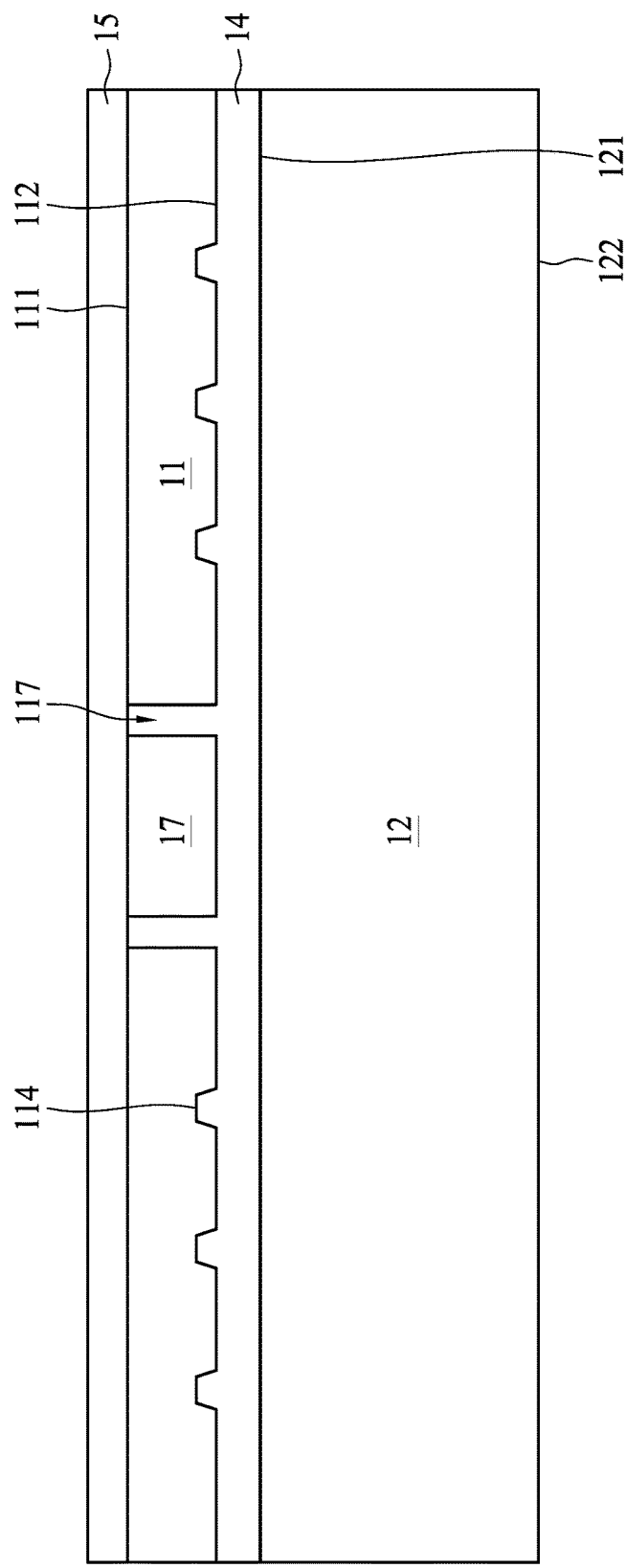

In operation 707, a first polymeric layer 15 is disposed over the first substrate 11 as shown in FIG. 8C. In some embodiments, the electronic device 17 is covered by the first polymeric layer 15. In some embodiments, the first polymeric layer 15 is in contact with the second polymeric layer 14. In some embodiments, the first polymeric layer 15 is disposed by spin coating or any other suitable operations. In some embodiments, the first polymeric layer 15 has similar configuration as the one described above or illustrated in any one of FIGS. 2 and 4.

Figure 8D:
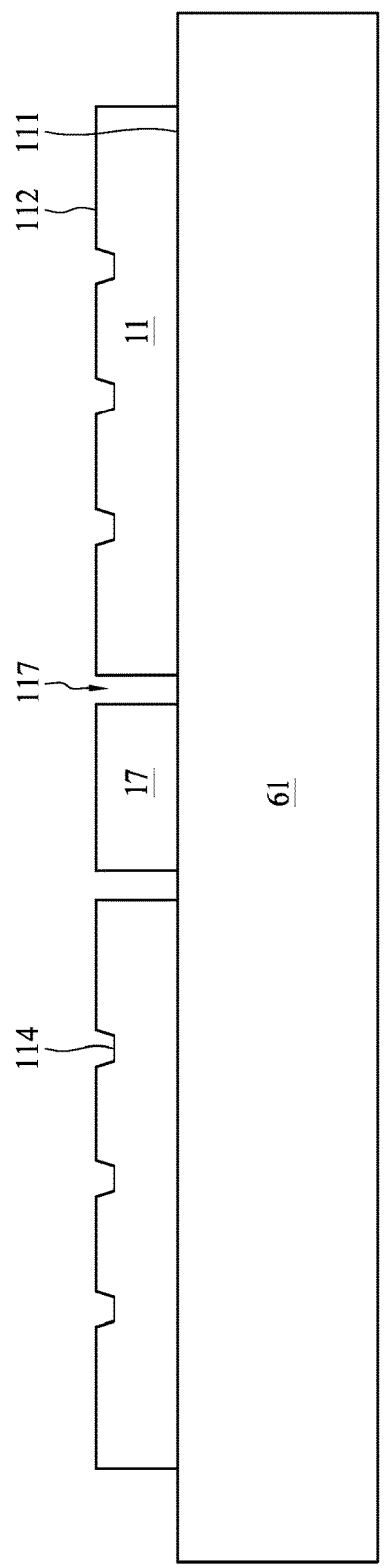

In some embodiments, the first substrate 11 and the electronic device 17 are flipped and placed on a carrier 61 after the operation 704, as shown in FIG. 8D. In some embodiments, the first substrate 11 is flipped and placed on the carrier 61 before the operation 704, and then the electronic device 17 is flipped and placed within the cavity 117 on the carrier 61. In some embodiments, the flipping of the first substrate 11 and the electronic device 17 includes vacuum operation or any suitable operations.

Figure 8E:
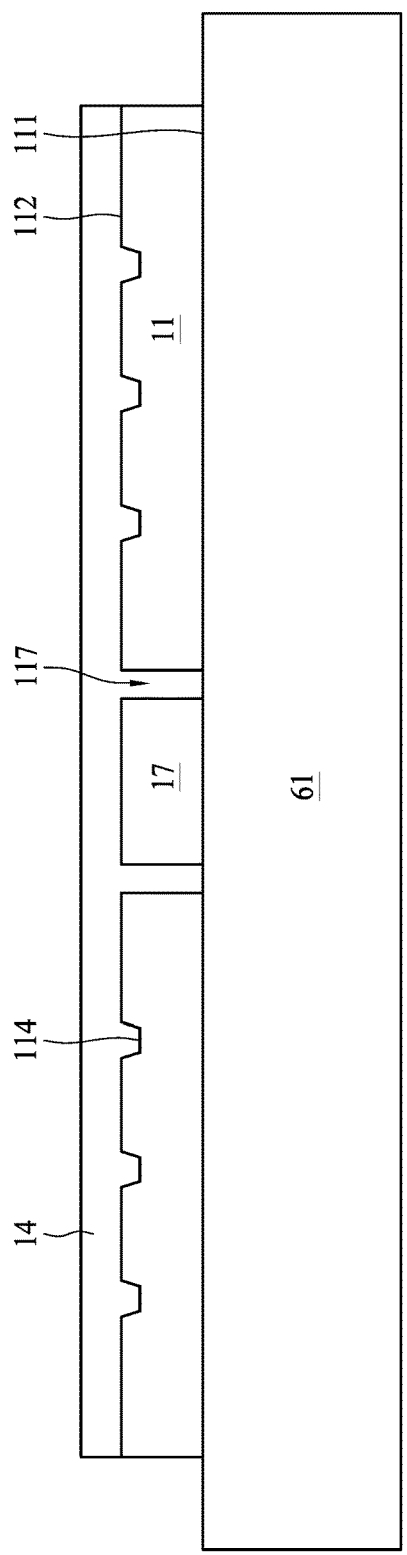
Figure 8F:
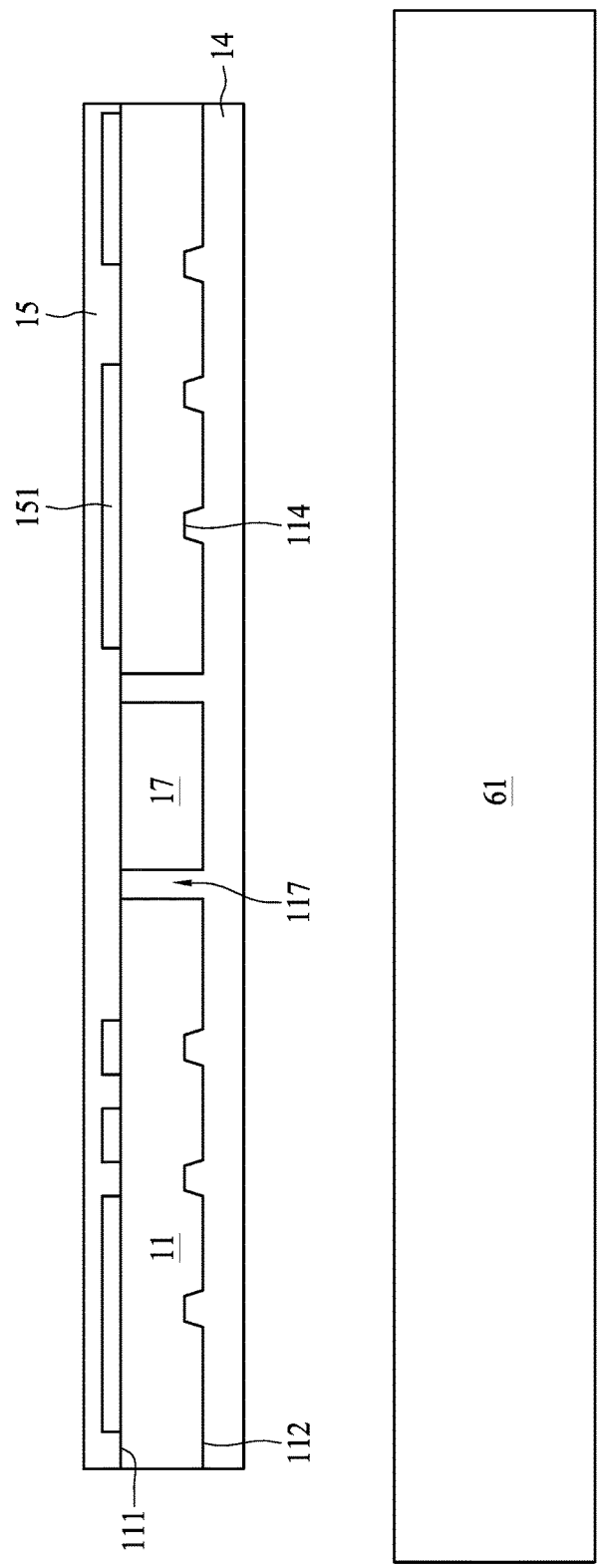

In some embodiments, the second polymeric layer 14 is disposed on the first substrate 11 and within the first recess 114 as shown in FIG. 8E. In some embodiments, the second polymeric layer 14 is disposed between the first substrate 11 and the electronic device 17. In some embodiments, the disposing of the second polymeric layer 14 includes flowing, spin coating, or any suitable operations. In some embodiments, the carrier 61 is removed after the disposing of the second polymeric layer 14, as shown in FIG. 8F. In some embodiments, the first polymeric layer 15 and the conductive line 151 are disposed over the first substrate 11 after the carrier 61 is removed, as shown in FIG. 8F.

In some embodiments, the carrier 61 is removed after the disposing of all features bonded to the first substrate 11 through the second polymeric layer 14. In some embodiments, the second substrate 12, the third polymeric layer 34, the third substrate 31 or other features described above are bonded to the first substrate 11 through the second polymeric layer 14 by hot pressing or any suitable operations.

Figure 8G:
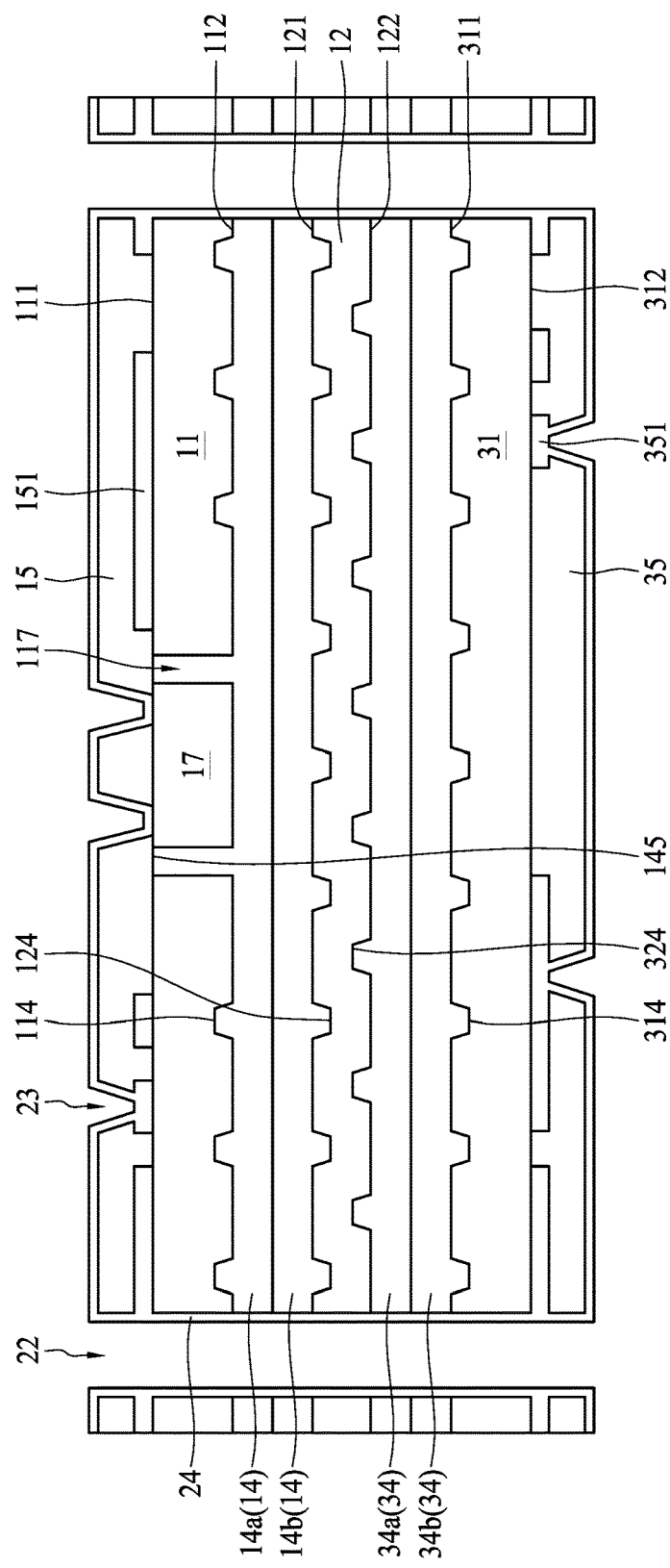

In some embodiments, as shown in FIG. 8G, the method 7 can include the operations of forming the second recess 124 and the third recess 324, receiving the third substrate 31, forming the fourth recess 314, bonding the second substrate 12 with the third substrate 31 with the third polymeric layer 34, forming the conductive lines 151 and 351, forming the through hole 22, forming the via 23, and forming the conductive layer 24, as the method 5 described above. In some embodiments, the operation of disposing the second polymeric layer 14 can include disposing two polymeric layers 14a and 14b. In some embodiments, the operation of disposing the third polymeric layer 34 can include disposing two polymeric layers 34a and 34b. In some embodiments, the polymeric layers 14a, 14b, 34a and 34b have similar configurations as the ones described above or illustrated in FIG. 4.

Figure 9:
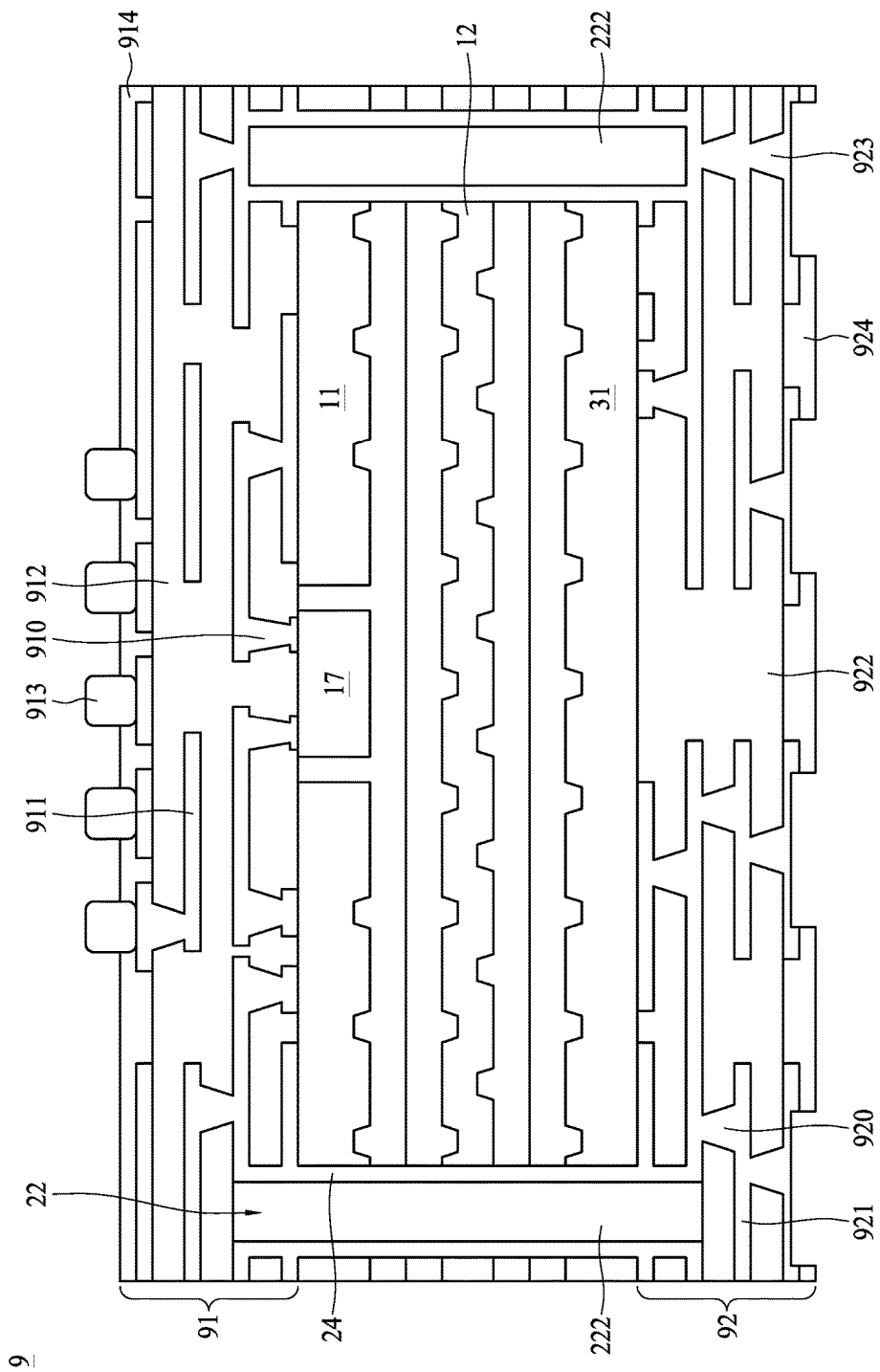
FIG. 9 is a cross sectional view of an interconnect structure in accordance with some embodiments of the present disclosure.

FIG. 9 is a cross sectional view of an interconnect structure 9 in accordance with some embodiments of the present disclosure. In some embodiments, the interconnect structure 9 has similar configurations as the interconnect structures 4 illustrated in FIG. 4, and similar features are denoted with same numeral annotations. In some embodiments, the interconnect structure 9 has a first connecting layer 91 and a second connecting layer 92. In some embodiments, the first connecting layer 91 has conductors such as a via 910, a trace 911 or a solder bump 913. In some embodiments, the first connecting layer 91 has an insulation layer 912 or a solder resist layer 914. In some embodiments, the solder bump 913 is exposed from the solder resist 914. In some embodiments, an external semiconductor device (not shown) is connected to the interconnect structure 9 by the first connecting layer 91. In some embodiments, the external semiconductor device is electrically connected to the interconnect structure 9 by the solder bump 913, an extra wire structure, or any suitable structures. In some embodiments, the second connecting layer 92 has conductors such as a via 920, a trace 921 or a pad 923. In some embodiments, the second connecting layer 92 has an insulation layer 922 or a solder resist layer 924. In some embodiments, the pad 923 is exposed from the solder resist 924. In some embodiments, an external circuit board (not shown) is connected to the interconnect structure 9 by the second connecting layer 92. In some embodiments, the external circuit board is electrically connected to the interconnect structure 9 by the pad 923, an extra wire structure or any suitable structures. In some embodiments, the external semiconductor device is electrically connected to the external circuit board by the interconnect structure 9.

In some embodiments, an interconnect structure comprises a first substrate including a first surface, a second surface opposite to the first surface, a cavity extended through the first substrate, and a first recess extended from the second surface towards the first surface; a second substrate disposed opposite to the second surface of the first substrate; a electronic device disposed within the cavity; a first polymeric layer disposed over the first surface and within the cavity of the first substrate; and a second polymeric layer disposed between the first substrate and the second substrate and within the first recess.

In some embodiments, the second polymeric layer comprises prepreg (PPG). In some embodiments, a thickness of the cavity is same as a thickness of the first substrate. In some embodiments, the first substrate and the second substrate comprise resin and glass fiber. In some embodiments, a thickness of the first substrate is smaller than or equal to 200 um. In some embodiments, the first polymeric layer comprises resin, ABF resin or epoxy. In some embodiments, a dimension of the interconnect structure is about 10×10 mm to about 99×99 mm. In some embodiments, a total thickness of the interconnect structure is about 200 um to about 2 mm. In some embodiments, the interconnect structure further comprises an interface between the first polymeric layer and the second polymeric layer, wherein the interface is coplanar with the second surface of the first substrate. In some embodiments, the second substrate includes a second recess extended into the second substrate, and the second polymeric layer is disposed within the second recess. In some embodiments, the first polymeric layer surrounds the electronic device and disposed between the electronic device and the first substrate. In some embodiments, a conductive line is disposed over the first surface of the first substrate and covered by the first polymeric layer.

In some embodiments, an interconnect structure comprises a first substrate including a first surface, a second surface opposite to the first surface, a cavity extended through the first substrate, and a first recess extended from the second surface towards the first surface; a second substrate disposed opposite to the second surface of the first substrate; an electronic device disposed within the cavity; a first polymeric layer disposed over the first surface of the first substrate and the electronic device; and a second polymeric layer disposed between the first substrate and the second substrate and within the cavity and the first recess.

In some embodiments, the second polymeric layer surrounds the electronic device and disposed between the electronic device and the first substrate. In some embodiments, the interconnect structure further comprises an interface between the first polymeric layer and the second polymeric layer, wherein the interface is coplanar with the first surface of the first substrate. In some embodiments, the interconnect structure further comprises a through hole extended through the first polymeric layer, the first substrate, the second polymeric layer and the second substrate; and a conductive layer disposed conformal to a sidewall of the through hole.

In some embodiments, a method of making an interconnect structure comprises receiving a first substrate including a first surface and a second surface opposite to the first surface; forming a cavity extended through the first substrate; forming a recess extended from the second surface towards the first surface; disposing an electronic device within the cavity; disposing a first polymeric layer over the first surface; receiving a second substrate; and bonding the first substrate with the second substrate by a second polymeric layer, wherein the second polymeric layer is disposed between the first substrate and the second substrate and within the recess.

In some embodiments, the forming of the recess includes removing a portion of the first substrate from the second surface by laser or etching operations. In some embodiments, the bonding of the first substrate with the second substrate includes flowing the second polymeric layer between the first substrate and the second substrate and hot pressing the first substrate and the second substrate towards each other. In some embodiments, the disposing of the first polymeric layer includes flowing the first polymeric layer into the cavity, or the bonding of the first substrate with the second substrate includes flowing the second polymeric layer into the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departs from the spirit and scope of the present disclosure.

The invention claimed is:

1. An interconnect structure, comprising:
a first substrate including a first surface, a second surface opposite to the first surface, a cavity extended through the first substrate, and a first recess extended from the second surface towards the first surface;
a second substrate disposed opposite to the second surface of the first substrate;
an electronic device disposed within the cavity;
a first polymeric layer disposed over the first surface and within the cavity of the first substrate; and
a second polymeric layer disposed between the first substrate and the second substrate and within the first recess.

2. The interconnect structure of claim 1, wherein the second polymeric layer comprises prepreg (PPG).

3. The interconnect structure of claim 1, wherein a thickness of the cavity is same as a thickness of the first substrate.

4. The interconnect structure of claim 1, wherein the first substrate and the second substrate comprise resin and glass fiber.

5. The interconnect structure of claim 1, wherein a thickness of the first substrate is smaller than or equal to 200 um.

6. The interconnect structure of claim 1, wherein the first polymeric layer comprises resin, ABF resin or epoxy.

7. The interconnect structure of claim 1, wherein a dimension of the interconnect structure is about 10×10 mm to about 99×99 mm.

8. The interconnect structure of claim 1, wherein a total thickness of the interconnect structure is about 200 um to about 2 mm.

9. The interconnect structure of claim 1, further comprising an interface between the first polymeric layer and the second polymeric layer, wherein the interface is coplanar with the second surface of the first substrate.

10. The interconnect structure of claim 1, wherein the second substrate includes a second recess extended into the second substrate, and the second polymeric layer is disposed within the second recess.

11. The interconnect structure of claim 1, wherein the first polymeric layer surrounds the electronic device and disposed between the electronic device and the first substrate.

12. The interconnect structure of claim 1, wherein a conductive line is disposed over the first surface of the first substrate and covered by the first polymeric layer.

13. An interconnect structure, comprising:
a first substrate including a first surface, a second surface opposite to the first surface, a cavity extended through the first substrate, and a first recess extended from the second surface towards the first surface;
a second substrate disposed opposite to the second surface of the first substrate;
an electronic device disposed within the cavity;
a first polymeric layer disposed over the first surface of the first substrate and the electronic device; and
a second polymeric layer disposed between the first substrate and the second substrate and within the cavity and the first recess.

14. The interconnect structure of claim 13, wherein the second polymeric layer surrounds the electronic device and disposed between the electronic device and the first substrate.

15. The interconnect structure of claim 13, further comprising an interface between the first polymeric layer and the second polymeric layer, wherein the interface is coplanar with the first surface of the first substrate.

16. The interconnect structure of claim 13, further comprising:
a through hole extended through the first polymeric layer, the first substrate, the second polymeric layer and the second substrate; and
a conductive layer disposed conformal to a sidewall of the through hole.

17. A method of manufacturing an interconnect structure, comprising:
receiving a first substrate including a first surface and a second surface opposite to the first surface;
forming a cavity extended through the first substrate;
forming a recess extended from the second surface towards the first surface;
disposing an electronic device within the cavity;
disposing a first polymeric layer over the first surface;
receiving a second substrate; and
bonding the first substrate with the second substrate by a second polymeric layer, wherein the second polymeric layer is disposed between the first substrate and the second substrate and within the recess.

18. The method of claim 17, wherein the forming of the recess includes removing a portion of the first substrate from the second surface by laser or etching operations.

19. The method of claim 17, wherein the bonding of the first substrate with the second substrate includes flowing the second polymeric layer between the first substrate and the second substrate and hot pressing the first substrate and the second substrate towards each other.

20. The method of claim 17, wherein the disposing of the first polymeric layer includes flowing the first polymeric layer into the cavity, or the bonding of the first substrate with the second substrate includes flowing the second polymeric layer into the cavity.

* * * * *